(12) United States Patent
German et al.

(10) Patent No.: US 9,748,082 B2
(45) Date of Patent: Aug. 29, 2017

(54) APPARATUS FOR CYLINDRICAL MAGNETRON SPUTTERING

(71) Applicant: Cardinal CG Company, Eden Prairie, MN (US)

(72) Inventors: John R. German, Prairie du Sac, WI (US); Klaus H. W. Hartig, Avoca, WI (US)

(73) Assignee: Cardinal CG Company, Eden Praire, MN (US)

( * ) Notice: Subject to any disclaimer, the term of this patent is extended or adjusted under 35 U.S.C. 154(b) by 251 days.

(21) Appl. No.: 13/790,340

(22) Filed: Mar. 8, 2013

(65) Prior Publication Data

US 2014/0054168 A1 Feb. 27, 2014

(51) Int. Cl.
*C23C 14/00* (2006.01)
*H01J 37/34* (2006.01)
*C23C 14/35* (2006.01)
*C23C 14/34* (2006.01)
*C23C 14/56* (2006.01)

(52) U.S. Cl.
CPC ...... *H01J 37/3452* (2013.01); *C23C 14/3407* (2013.01); *C23C 14/35* (2013.01); *C23C 14/352* (2013.01); *H01J 37/3405* (2013.01); *H01J 37/347* (2013.01); *C23C 14/562* (2013.01); *H01J 2237/334* (2013.01)

(58) Field of Classification Search
CPC ... H01J 37/3405; H01J 37/347; H01J 37/3452
See application file for complete search history.

(56) References Cited

U.S. PATENT DOCUMENTS

| 6,375,814 | B1 * | 4/2002 | De Bosscher et al. .. 204/298.21 |
| 6,660,365 | B1 | 12/2003 | Krisko et al. |
| 6,716,369 | B1 | 4/2004 | Jung et al. |
| 6,964,731 | B1 | 11/2005 | Krisko et al. |
| 6,974,629 | B1 | 12/2005 | Krisko et al. |
| 7,993,496 | B2 | 8/2011 | Hartig et al. |
| 2004/0178056 | A1 * | 9/2004 | De Bosscher ...... H01J 37/3405 204/192.12 |
| 2008/0047831 | A1 * | 2/2008 | Richert ............... C23C 14/3407 204/298.12 |

(Continued)

FOREIGN PATENT DOCUMENTS

| EP | 2216424 A1 | 8/2010 |
| JP | 05163567 A * | 6/1993 |
| WO | 9954911 A1 | 10/1999 |

OTHER PUBLICATIONS

Abstract of JP05163567A.*

(Continued)

*Primary Examiner* — Ibrahime A Abraham
(74) *Attorney, Agent, or Firm* — Fredrikson & Byron, P.A.

(57) ABSTRACT

A cathode target assembly for use in sputtering target material onto a substrate includes a generally cylindrical target and a magnetic array. The magnetic array is adapted to provide a plasma confinement region adjacent an outer surface of the target. End portions of the magnetic array are adapted to make the shape and strength of the confinement field at the turns of the racetrack closely match the shape and strength of the confinement field along the straight part of the racetrack so as to significantly reduce cross-corner effect.

35 Claims, 13 Drawing Sheets

(56) References Cited

U.S. PATENT DOCUMENTS

2011/0062022 A1* 3/2011 Goderis et al. .......... 204/298.12
2011/0240468 A1   10/2011 Hollars

OTHER PUBLICATIONS

Krisko et al., U.S. Appl. No. 09/572,766, filed May 17, 2000, 35 pages.
International Search Report and the Written Opinion for International Application. No. PCT/US2013/029810, mailed Jul. 23, 2013, 11 pages, European Patent Office.

* cited by examiner

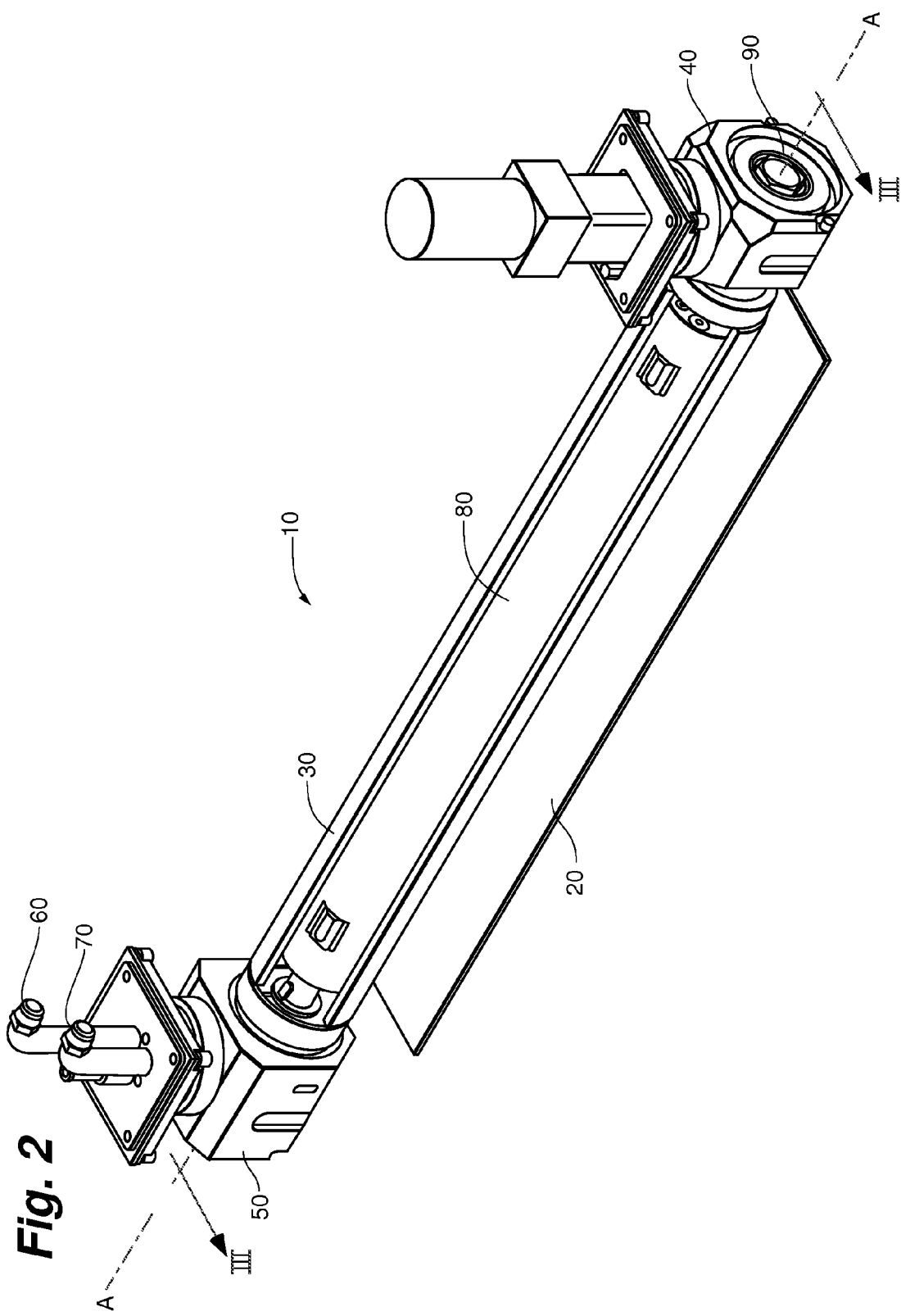

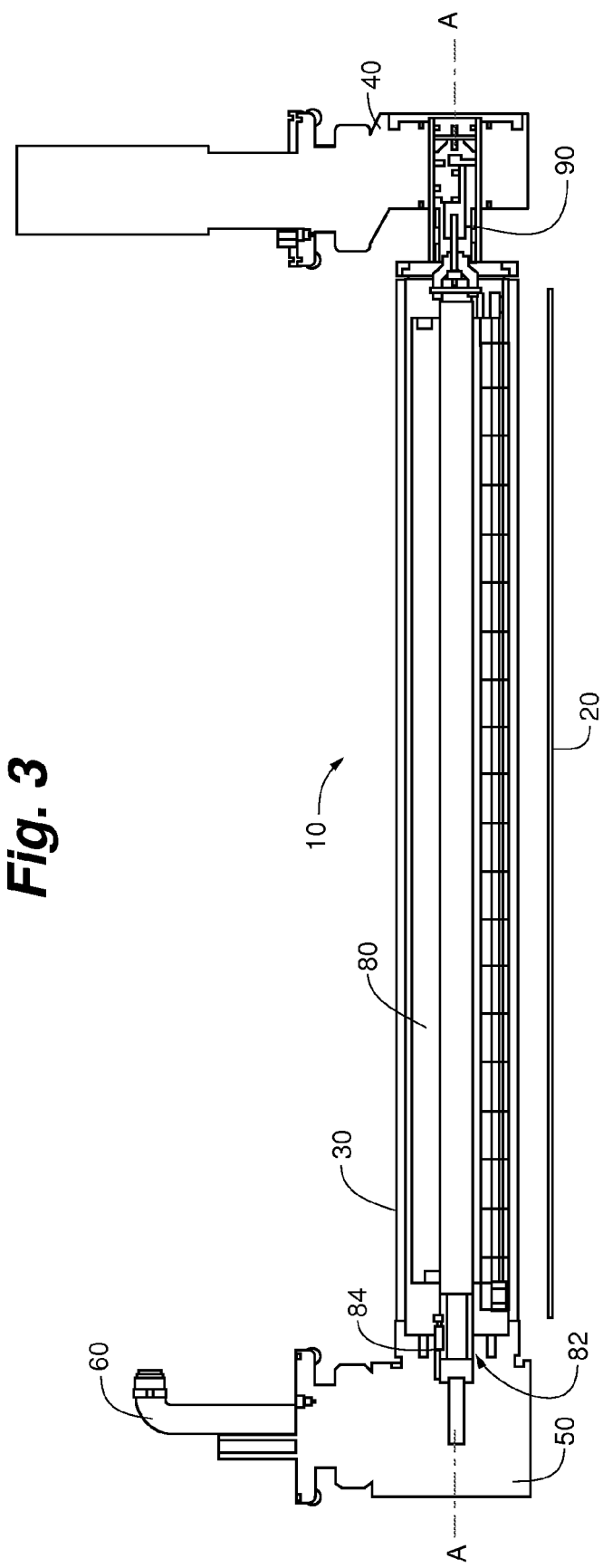

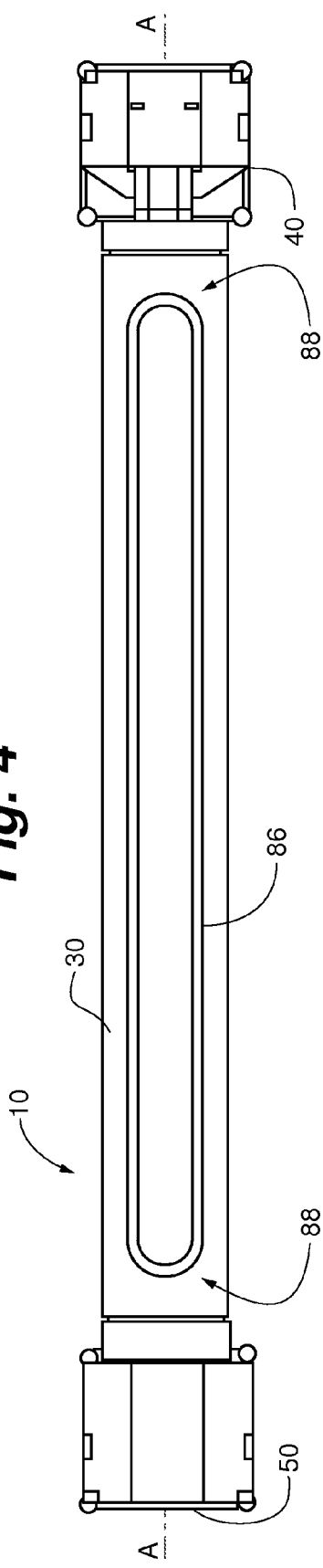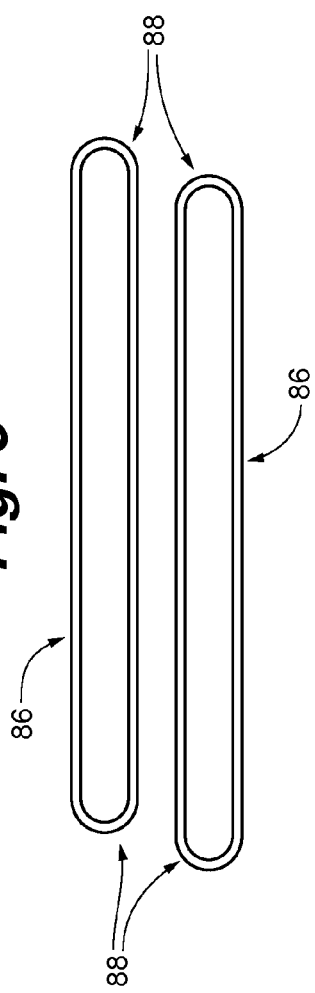

APPARATUS FOR CYLINDRICAL MAGNETRON SPUTTERING

CROSS-REFERENCE TO RELATED APPLICATION

This patent application claims priority to provisional U.S. Patent Application No. 61/693,032, filed on Aug. 24, 2012, the entire contents of which are hereby incorporated by reference herein.

FIELD OF THE INVENTION

The invention relates to apparatus for depositing films on surfaces, and more particularly to configurations of such apparatus for improving target utilization and deposition uniformity during magnetron sputtering operations.

BACKGROUND

A variety of methods exist to apply coatings, such as thin films, to substrates, such as glass. Generally, sputtering is a technique for forming a thin film on a substrate. Sputtering techniques include diode sputtering, triode sputtering, and magnetron sputtering.

Magnetron sputtering has become a widely-used sputtering technique. Films formed by sputtering can be important for numerous devices, such as semiconductors and window glass. Films, created by these processes, are typically formed with metallic materials such as silver, aluminum, gold, and tungsten, or dielectric materials such as zinc oxide, tin oxide, titanium oxide, silicon oxide, silicon nitride, and titanium nitride.

Magnetron sputtering involves providing a target, including or formed of a metal or dielectric material, and exposing the target to a plasma in a deposition chamber. Ions formed in the plasma are generally accelerated toward the target due to the presence of an electric field. Momentum from this ion bombardment is transferred to the target's surface, thereby causing atoms of the target to gain enough energy to leave the surface of the target. Some of the atoms leaving the surface of the target in this manner are, in turn, deposited on a substrate being passed proximate to the target, thereby providing a coating layer on the substrate.

The gas used to form the plasma can be an inert, non-reacting gas, such as argon. Alternately, or additionally, reactive gases, such as nitrogen or oxygen, can be used to form the plasma. Reactive gases can combine with sputtered atoms during the formation of the sputtered coating. Deposition of reacted compounds, such as zinc oxide, tin oxide, etc., can be achieved in this manner.

To improve the efficiency of the sputtering process (i.e., to improve sputtering rate), the number of available ions can be raised by increasing the density of the plasma. To obtain a high-density plasma, an electric field and a magnetic field can be used together to produce a resultant force on electrons that tends to keep the electrons in a region near the surface of the target (i.e., the "plasma-containing region," or "confinement region"). The resultant force on electrons in such a region is governed by the vector cross product of the electric and magnetic fields (the "E×B" drift path). For example, a magnetic field can be formed such that the magnetic lines of flux are in a direction that is generally parallel to the surface of the target. In turn, an electric field can be provided (e.g., by applying a voltage to the target) to accelerate electrons in a direction perpendicular to the surface of the target. The resultant force on the ions is defined by the "E×B" drift path and is in a direction perpendicular to both the electric and magnetic fields, governed by the "right hand rule." This force on the electrons results in "electron drift paths," which can be used to keep the electrons near the surface of the target, where they can collide with other neutral atoms or molecules (from the plasma or sputtered atoms from the target), thereby causing further ionizations and increasing the sputtering rate.

The magnetic fields used in sputtering magnetrons are typically provided by placing one or more magnets behind the target to help shape the plasma and focus the plasma in an area adjacent the target's surface, or confinement region. In turn, the magnetic field lines are found to penetrate through the target and form arcs over the target surface such that the magnetic field lines are substantially parallel to the target surface. The plasma can be concentrated near the surface of the target by wrapping and joining the magnetic field lines upon themselves to form a closed-loop "racetrack" pattern. This can be done, for example, by using appropriately sized and shaped magnetic elements. An exemplary "planar magnetron" configuration is depicted in FIGS. 1(a) and 1(b), illustrating the formation of racetrack-shaped plasma-containing electron drift paths.

Planar magnetrons of such configuration tend to facilitate racetrack-shaped grooves being eroded into the targets, with such grooves resulting from continued sputtering in a racetrack pattern that is largely static relative to the target. Erosion is generally found to be strongest near the center of the path formed by the magnets (due to the increased confinement of plasma in this area), which tends to create a "V-shaped" racetrack groove in the target surface. As the groove deepens, it tends to have an adverse effect not only on the sputtering rate, but also on the uniformity of the film deposition on the substrate. As a result, the utilization of target material is typically quite low for planar magnetrons, with target utilization in some cases falling in the range of about 15% to 30% of total target volume.

In light of the above, cylindrical magnetron target assemblies have gained popularity in the industry. In such assemblies, the target material is often tube shaped, forming a longitudinal cavity within which a magnet assembly is located. The cylindrical target is adapted to be rotated about its longitudinal axis. In contrast, the magnet assembly within the target does not typically rotate about this axis; rather, it is commonly held in a fixed position relative to the rotating cylindrical target. The magnets in a cylindrical magnetron typically form narrow racetracks extending substantially the length of the cylindrical target. By rotating the cylindrical target relative to the magnet assembly, these types of magnetrons help address the problem of low target material utilization encountered with planar magnetron target assemblies by lessening the effects of racetrack grooving. In particular, the degree of surface erosion grooving is so reduced that target utilization of greater than 80% can generally be achieved.

Although the use of cylindrical magnetron targets has resulted in improved target utilization, it has been difficult to simultaneously optimize target utilization and sputtering uniformity.

The present invention addresses these and other problems.

SUMMARY OF THE INVENTION

In certain embodiments of the invention, a cathode target assembly for use in sputtering target material onto a substrate includes a generally cylindrical target and a magnetic array. The generally cylindrical target extends about a longitudinal axis, and is configured to rotate about the axis. The magnetic array is carried within the target and maintained in a substantially static state as to rotation within the target. The array forms a racetrack configuration comprising inner and outer magnetic poles. The racetrack configuration has a straight portion and opposing end portions thereof. The inner and outer magnetic poles extend parallel to each other in a first direction along the straight portion, and the inner and outer magnetic poles fan outward from the first direction in forming the end portions.

In further certain embodiments of the invention, a cathode target assembly for use in sputtering target material onto a substrate includes a generally cylindrical target and a magnetic array. The generally cylindrical target extends about a longitudinal axis, and is configured to rotate about the axis. The magnetic array is carried within the target and maintained in a substantially static state as to rotation within the target. The array forms a racetrack configuration comprising inner and outer magnetic poles. The racetrack configuration has a straight portion and opposing end portions thereof. The inner and outer magnetic poles extend parallel to each other in a first direction along the straight portion. Each of the end portions has a fan-shaped profile. One or more of the end portions are adapted to be selectively adjustable in orientation relative to the cylindrical target.

DESCRIPTION OF THE DRAWINGS

FIG. 2 is a partial cut-away perspective view of a cylindrical magnetron target assembly in accordance with certain embodiments of the invention.

FIG. 3 is a cross-sectional front view of the cylindrical magnetron target assembly of FIG. 2, along the lines III-III.

FIG. 4 is a bottom view of the cylindrical magnetron target assembly of FIG. 2 exemplifying a representative electron drift path pattern on the cylindrical target.

FIG. 5 is a schematic planar representation of dual electron drift path patterns.

DETAILED DESCRIPTION

Figure 1A:
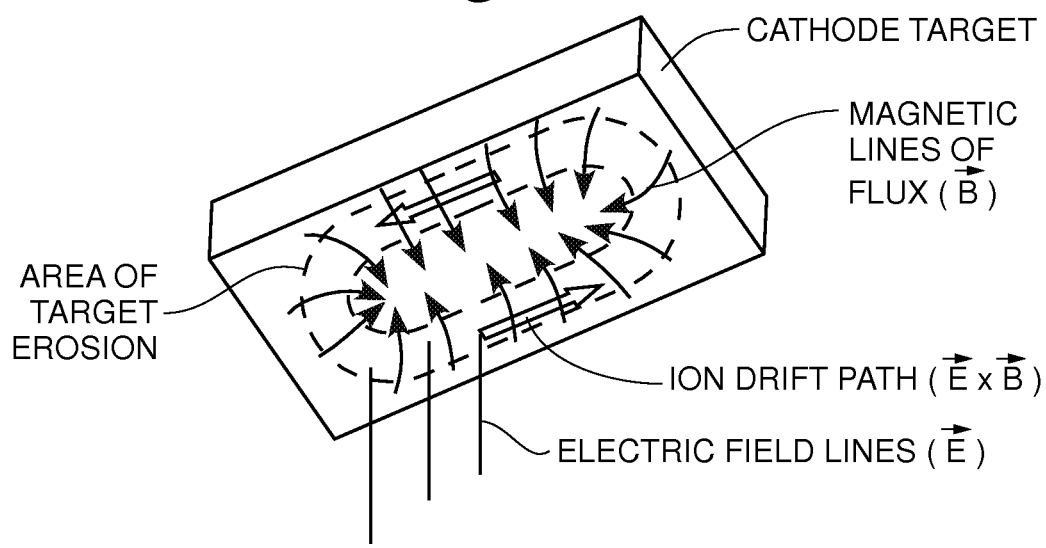
FIG. 1(a) is a schematic representation of a planar magnetron target and illustrates formation of an electron drift path pattern in the target during a sputtering process.
Figure 1B:
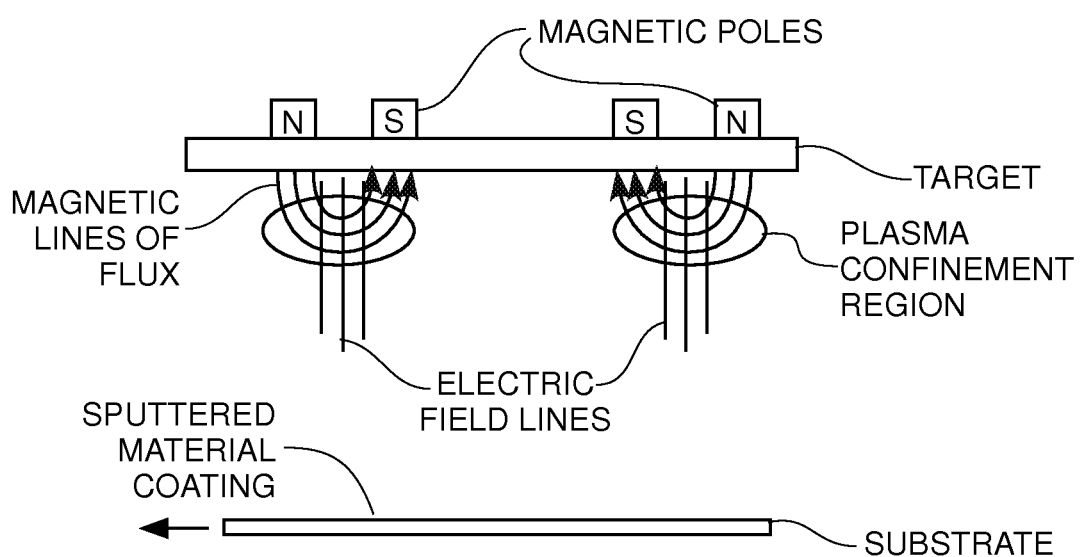
FIG. 1(b) is a further schematic representation of the planar magnetron target of FIG. 1(a) in exemplary relation to a substrate being passed there under for deposition of material from the target on the substrate during a sputtering process.

The following detailed description should be read with reference to the drawings, in which like elements in different drawings are numbered identically. The drawings depict selected embodiments and are not intended to limit the scope of the invention. It will be understood that embodiments shown in the drawings and described below are merely for illustrative purposes, and are not intended to limit the scope of the invention as defined in the claims.

Cylindrical Magnetron Target Assemblies and Exemplary Substrates

As already described, one drawback to using planar magnetron targets for sputtering applications has been poor optimization of the target material. By using cylindrical magnetron targets as an alternative, target optimization has been greatly increased. Such increased optimization is generally achieved by keeping the magnet assembly stationary while rotating the cylindrical target about it. Such a cylindrical magnetron target, along with its corresponding assembly, is depicted in FIGS. 2 and 3, detailed below.

FIG. 2 is a partial cut-away perspective view of a cylindrical magnetron target assembly in accordance with certain embodiments of the invention, while FIG. 3 is a cross-sectional front view of the assembly of FIG. 2. During a sputtering process, the target assembly (referenced as 10) is used for coating a substrate 20 with material from a cylindrical target 30 of the assembly 10. Examples of materials which can form at least part of the cylindrical target 30 and be sputtered include metals, for example, silver, aluminum, gold, chromium, copper, nickel, zinc, tin, titanium, and niobium. In other examples, compounds of various metals, such as nickel-chromium, can be sputtered using targets made of the desired compound. In addition, silicon can be used as cylindrical target material, for example, by plasma spraying silicon onto a support tube.

In certain embodiments, the cylindrical target 30 is rotatable about its longitudinal axis A, typically by means of a motor (e.g., an electric motor) or other such motive device. In some embodiments, the motive device/rotating means comprises a drive end block 40 containing a motor suitable for rotating the cylindrical target 30. As shown, the target assembly 10 can be optionally provided with a support end block 50, suitable for supporting the cylindrical target 30 opposite the drive end block 40. In certain embodiments, the support end block 50 can house a cooling fluid inlet 60 and a cooling fluid outlet 70. The cooling fluid inlet 60 and cooling fluid outlet 70 can provide cooling water to the cylindrical target 30 to cool it during the sputtering process. Alternatively, the cathode target assembly 10 can be cantilevered, thereby not requiring the support end block 50.

The cathode target assembly 10 includes a magnetic array (or magnetron) assembly 80 for generation of a plasma confinement field adjacent a surface of the target 30. In certain embodiments, the magnetron assembly 80 is disposed within the cylindrical target 30 (e.g., within an interior recess bounded by the cylindrical target). With reference to FIG. 3, in certain embodiments, a framework 82 (or similar support means) is provided for supporting the magnetron assembly 80, optionally independent of the rotation of the target 30 (e.g., such that the magnetron assembly 80 can be maintained in a static, or substantially static, state). For example, as shown, the framework 82 can include a key 84. The key 84 can be adapted to prevent the magnetron assembly 80 from rotating during rotational movement of the target 30 (i.e., independently of rotation of the target 30) using conventional methods known in the art. The framework 82 and the key 84 may additionally be adapted to allow movement of the magnetron assembly 80, or portions thereof, in a direction generally parallel to the longitudinal axis A of the target 30, according to certain embodiments of the invention.

A variety of substrates are suitable for use with the present invention. In most cases, the substrate 20 is a sheet of transparent material (i.e., a transparent sheet). However, the substrate 20 is not required to be transparent. For example, opaque substrates may be useful in some cases. However, it is anticipated that for most applications, the substrate 20 is formed of a transparent or translucent material, such as glass or clear plastic. In many cases, the substrate 20 is a glass sheet. A variety of known glass types can be used, and soda-lime glass is expected to be preferred.

Substrates of various sizes can be used in the present invention. For example, the invention can be used to process large-area substrates. Certain embodiments of the invention can process a substrate having a width of at least about 0.5 meter, preferably at least about 1 meter, perhaps more preferably at least about 1.5 meters (e.g., between about 2 meters and about 4 meters), and in some cases at least about 3 meters. Substrates of various thicknesses can also be used with certain embodiments of the invention. Commonly, substrates with a thickness of between about 1 mm and 5 mm are used. Some embodiments involve a substrate with a thickness of between about 2.3 mm and about 4.8 mm, and perhaps more preferably between about 2.5 mm and about 4.8 mm. For example, in some cases, a sheet of glass (e.g., soda-lime glass) with a thickness of about 3 mm can be used.

The embodied invention is particularly advantageous in processing large-area substrates, such as glass sheets for architectural and automotive glass applications. With large-area substrates in particular (especially those formed of glass), it is desirable to convey the substrates through a deposition chamber in a horizontal orientation, rather than in a vertical orientation. Substrates of this nature commonly have a width of at least about 0.5 meter, more commonly at least about one meter, and typically greater than about 1.5 meters (e.g., between about 2 meters and about 4 meters).

Thus, in order to sputter material substantially across the entire width of such a substrate (i.e., a substrate having a width in one or more of the above ranges), a substantial extent of the target is used. Consequently, achieving good sputtering uniformity across such a target extent can be particularly important.

Target Utilization, Sputtering Uniformity, and The Cross-Corner Effect

As described above, using cylindrical targets in sputtering applications has facilitated a means for improving target utilization. However, it has been difficult to simultaneously optimize both target utilization and sputtering uniformity. In particular, and with reference to the conventional magnetron assembly 100 shown in FIG. 7, excess erosion is generally encountered in the target areas proximate to the turnarounds 150 of the assembly 100. This problem is more easily understood with reference to FIG. 4.

Figure 7:
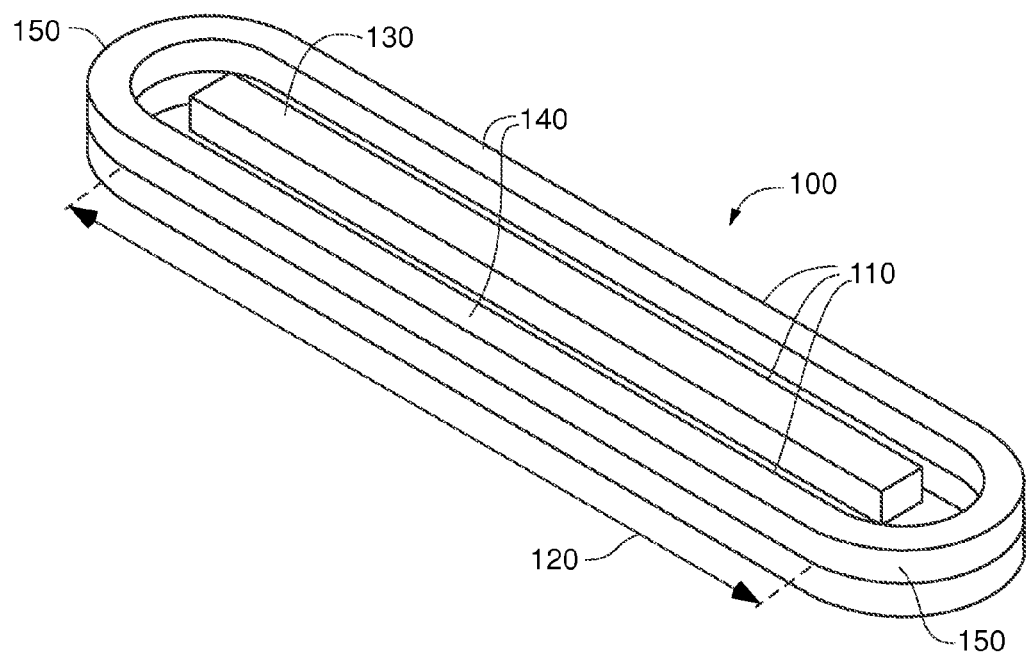
FIG. 7 is a perspective view of a conventional sputtering magnetron design used with cylindrical magnetron target assemblies.

Again with reference to the conventional magnetron assembly 100 of FIG. 7, FIG. 4 shows a corresponding target wear pattern on the cylindrical target 30. It should be appreciated that the pattern shown would be formed in a continuous manner around the outer surface of the target 30, yet the pattern is illustrated in static fashion (as if the target 30 were held stationary relative to the magnetron) for clarity to the reader. As described above, using conventional race-track-shaped magnetrons, a greater degree of sputtering is found to occur over time at the end regions 88 of the cylindrical target 30 (proximate to the magnetron turns 150) as opposed to at the mid-region 86 of the target 30 (proximate to the magnetron straight portions 110). One reason for this problem is the uneven charge balance between inner and outer poles at the magnetron turnarounds 150, resulting in the cross-corner effect. Such effect, as further described below, leads to the end regions 88 of the cylindrical target 30 becoming depleted of sputterable target material at a faster rate than the mid-region 86 of the target 30. This results not only in non-uniform sputtering across the target's extent, but also dictates premature replacement of the target 30 (i.e., prior to target material at the mid-region 86 being adequately utilized).

Similar to that shown in FIG. 4, FIG. 5 shows a schematic planar representation of dual electron drift path patterns (with erosion of a corresponding target corresponding to such patterns). For clarity to the reader and similar to that described above with regard to FIG. 4, the drift patterns in FIG. 5 are shown as if the target were held stationary relative to the magnetron. However, it should again be appreciated that such patterns would be formed in a continuous manner around the outer surface of the target. Configuring a magnetron, or pair of magnetrons, to provide such dual erosive patterns on a cylindrical target is one technique attempted to provide sputtering variability at the target ends. However, many of the same problems with sputtering uniformity described above have been found to persist due to continuing charge imbalance at the magnetron turnarounds.

Figure 6:
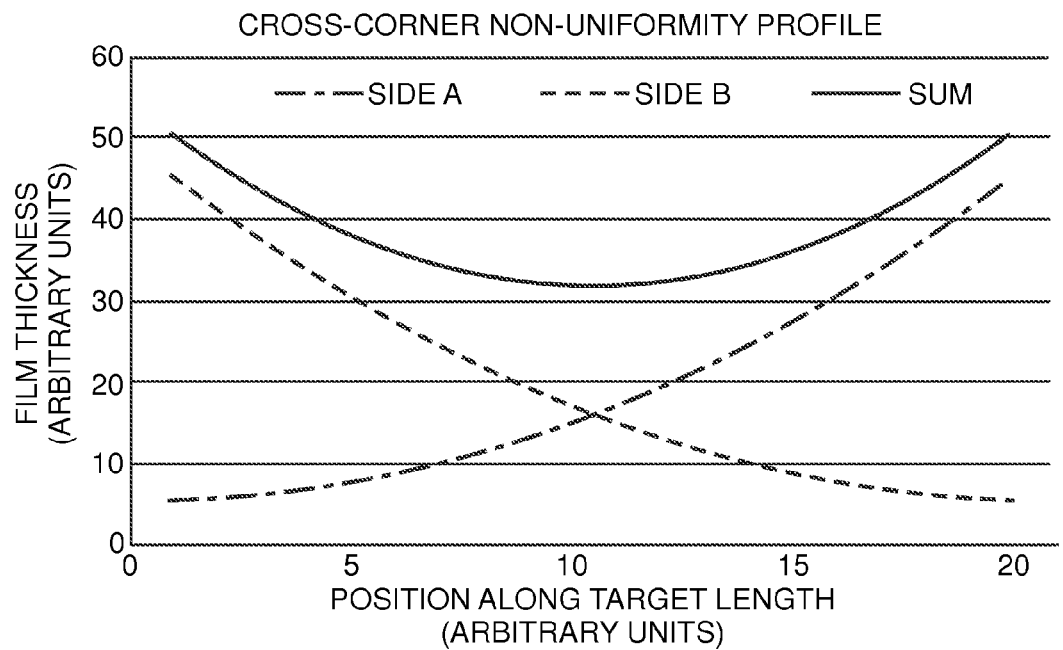
FIG. 6 is a representation of the cross-corner effect in graphical form, showing deposited film thickness in relation to position along the target length.

Regarding the sputtering uniformity problems, continued reference is made to the conventional magnetron assembly 100 illustrated in FIG. 7. In particular, the plasma formed about such magnetron is found to be relatively tenuous extending away from the magnet assembly turnarounds 150. Consequently, the sputtering rates along such areas of the target are found to be low. Proceeding along the straight portions 110 of the magnetron, the plasma density (hence, sputter rate) builds back up. As alluded to above, this phenomenon is commonly known as the cross-corner effect. FIG. 6 shows a representation of such effect in graphical form, with deposited film thickness being depicted in relation to position along the target length. As illustrated, the sum of the deposition (shown as the solid plot line) shows a non-uniform outcome at the target end regions, i.e., proximate to the magnet assembly turns, resulting in greater collective erosion as compared to the mid-regions of the target, i.e., proximate to the magnetron assembly straight portions. Thus, one is left with excessive deposition occurring at the target ends.

In cases involving metallic sputtering or full-reactive mode sputtering, the plasma density can reach saturation relatively soon after the magnet assembly turns such that the resulting non-uniformity is relatively slight. However, in cases not involving fully-metallic or fully-reactive modes (e.g., involving transition mode), the plasma density continues to build up to the turnaround at the other end of the target, leading to significant magnification of the deposition non-uniformity (as illustrated via the graph of FIG. 6). Transition mode is important in reactive sputtering when high sputter rates are desired to allow for better energy or machine efficiency, or if precise chemistry control of the resultant film is required.

Mitigating the cross-corner effect for planar magnetrons has been achieved by configuring their inner and outer magnet racetracks to have shapes that are similar. As a consequence, the plasma confinement fields proximate to the target ends can be configured to be substantially similar to those along the central length of the target, thereby achieving a charge balance over the magnetron. However, these solutions do not translate well to rotary cathodes involving racetrack magnetron assemblies due to size constraints of the cylindrical target used therewith. Such size constraints typically dictate a racetrack magnetron having narrowed configuration being used, with a single bar being used as the inner pole. While this configuration enables the size of the magnetron assembly to be compact and more adaptable for positioning within cylindrical targets, there is a corresponding lack of charge balance that can be achieved at the racetrack turnaround portions. Accordingly, a design which simultaneously provides both effective target utilization and sputtering uniformity has proved elusive for magnetron assemblies used with cylindrical targets.

In an attempt to counteract the cross-corner effect for magnetrons used with cylindrical targets, one known practice has involved weakening the magnetic confinement at the turnarounds (by weakening the corresponding electric field to the magnetron). The theory behind this practice was to compensate for the charge imbalance of the magnet assembly at said turnarounds. However, the practice has generally been found to change the overall shape of the confinement field at the target. For example, weakened magnetic confinement at the turnarounds can lead to electron losses and changes in the drift velocity, which results in spatial variations of plasma density and hence non-uniform sputtering rates. These effects are not immediately self-correcting and extend well beyond the immediate vicinity of the turnarounds. As such, even in weakening magnetic confinement at the turnarounds, there were undesirable effects introduced to the process, again leading to non-uniform deposition. Another technique for addressing poor sputtering uniformity has involved spatially varying the supply of reactive gas. Yet, this practice was also found to introduce additional, undesirable variables to the process, such that a gain in sputter uniformity could result in a loss in target utilization.

Embodied Characteristics of Inner and Outer Poles at Magnetron Turnarounds

In investigating the problem of excessive target erosion proximate to the magnetron turnarounds, the magnetic conditions achieved with conventional racetrack magnetrons were initially examined. As alluded to above, FIG. 7 shows a magnetron assembly 100 that is conventionally used with cylindrical target assemblies. Regarding the magnetron 100, along the straight portions 110 (and the extents 120 thereof), a substantial balance in magnetic charge can be achieved between the inner and outer (north and south) poles, 130 and 140 respectively. Such magnetic charge is achieved via careful configuration of factors such as sizes, spacing, and orientations of such poles. However, due to lack of space for the inner pole, it has been difficult configuring these same factors in achieving charge balance at the turnarounds 150. As described above, such imbalance at the turns 150 has been found to adversely impact sputtering uniformity with regard to the cylindrical target surrounding the magnetron.

Figure 8:
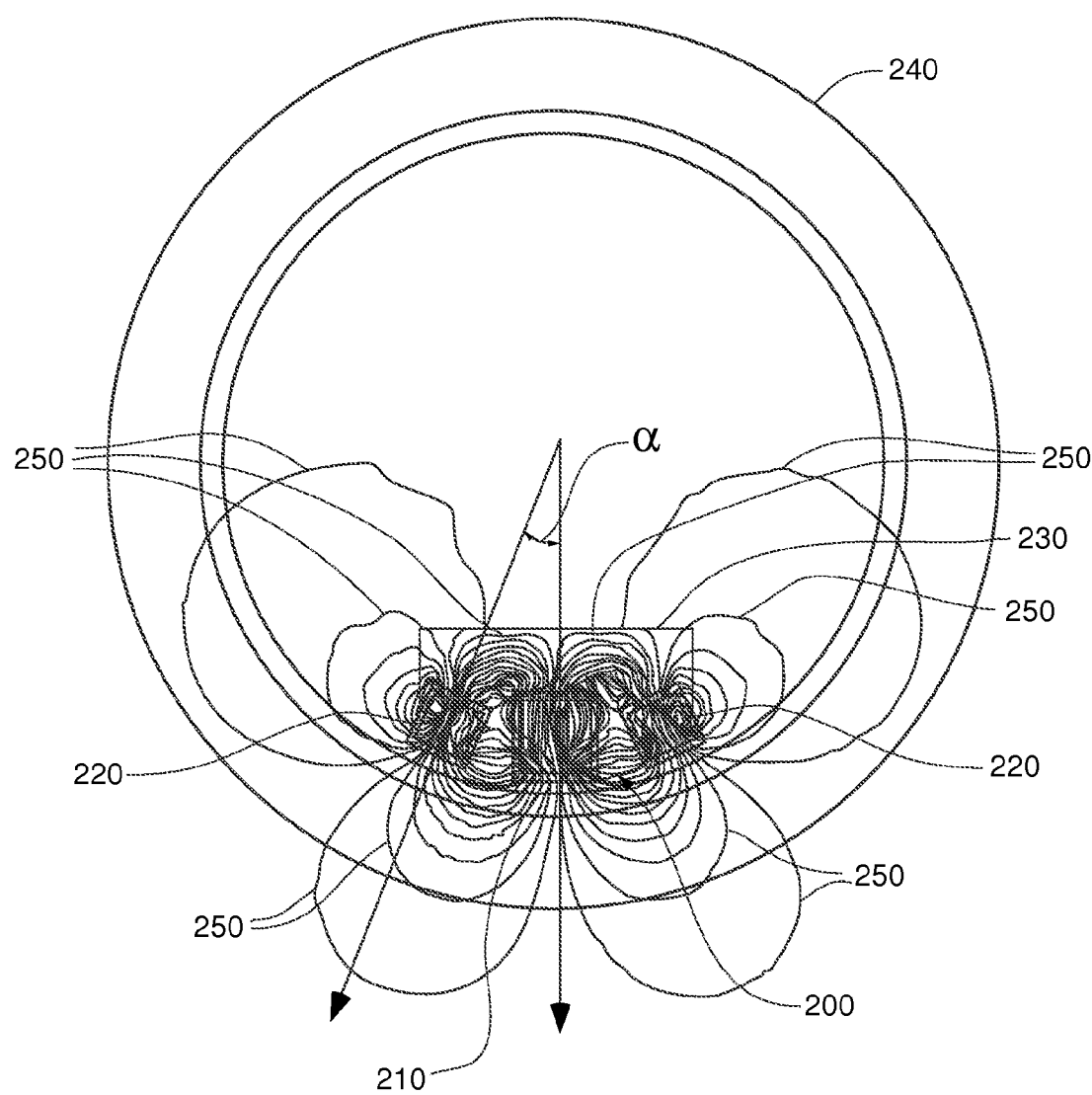
FIG. 8 is a cross-sectional side view of a straight portion of a magnetron assembly in accordance with certain embodiments of the invention, with the assembly situated within a cylindrical sputtering target and showing magnetic flux lines generated from the assembly.

With reference to the magnetron assembly 100 of FIG. 7, FIG. 8 shows a cross-sectional side view of a straight portion of a magnetron assembly 200 in accordance with certain embodiments of the invention. As illustrated, the magnetron assembly 200, involving inner and outer poles 210, 220 operatively joined to a support plate 230, is situated within a cylindrical target 240. FIG. 8 further shows the magnetic flux lines 250 generated, whereby magnetic field shapes can be modified, and thereby prescribed, by outwardly orientating (or angling) the outer poles 220 with respect to the inner pole 210. As should be appreciated, one effect of outwardly adjusting the orientation of the outer poles 220 (relative to the inner pole 210) is that a more uniform magnetic field effect can be achieved.

However, when such practice is applied to the magnetron turnarounds, it can be of particular use. As described below with reference to FIGS. 10 and 11, by prescribing orientation of the outer poles at the turnarounds (so as to achieve a more uniform magnetic field effect thereat), the magnetic conditions of the magnetron can be brought into better balance. Given the structural variances between the straight and turnaround portions of the magnetron, this is particularly important. Likewise, it would facilitate a means to lessen the cross-corner effect and the non-uniform sputtering that results there from. The angle of orientation a between each of the outer poles 220 and the inner pole 210 at the ends would vary based on a number of factors, such as overall size and extent of the magnetron. However, in certain embodiments, the angle $\alpha$ is in the range of between about 10° and about 40°, and in more preferable embodiments, in the range of between about 20° and about 30°, and perhaps most preferable, is about 25°.

Alternatively, and again with reference to the magnetron 100 of FIG. 7, FIGS. 9(a)-9(d) illustrate models of radial cross-section of a straight portion of a magnetron assembly 300, in accordance with certain embodiments of the invention. As shown, the modeled assemblies 300 have certain similarities to the magnetron assembly 200 of FIG. 8, yet depict varying ratios of materials for inner and outer magnet poles 310 and 320, respectively. In particular, the models of FIGS. 9(a)-9(d) are each of an annular assembly, with a general half-portion of the inner pole 310 represented on the left of each model and one of the outer poles 320 represented on the right of each model, with a support plate 330 operatively joining such poles. To that end, if the structure were to be revolved around the vertical line on the far left of each model (representing the axis of the annulus), the result would be a 3D structure of what is modeled.

Figure 9A:
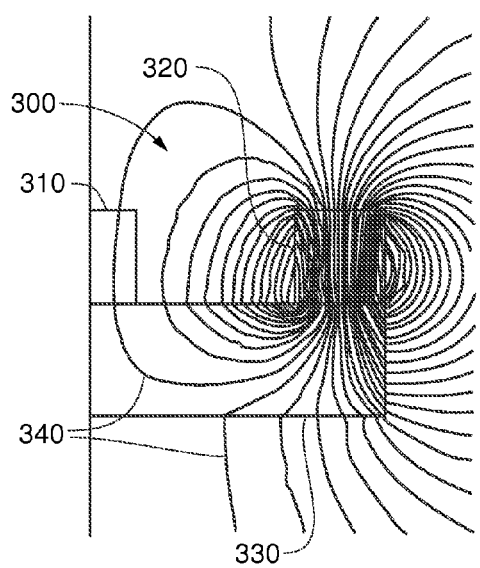
FIGS. 9(a)-9(d) illustrate models of radial cross-section of a straight portion of magnetron assemblies, each having a varying ratio of inner and outer magnet pole materials with magnetic flux lines generated and shown there between, in accordance with certain embodiments of the invention.
Figure 9B:
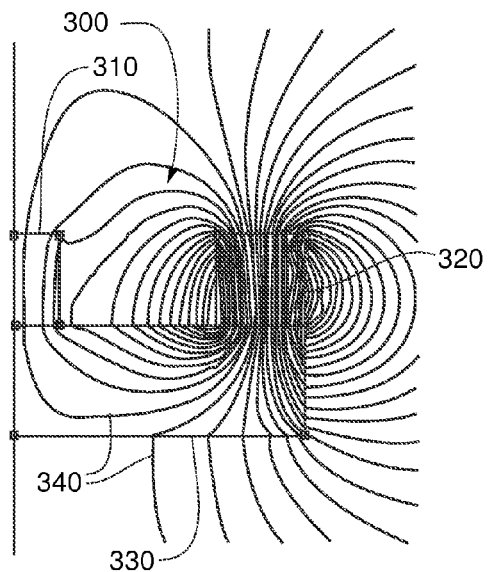

The inner pole 310 of the model of FIG. 9(a) is unmagnetized. In the other models (shown in FIGS. 9(b), 9(c), and 9(d)), the inner and outer poles 310, 320 have the same magnetization (but opposite polarity). In addition, the models of FIGS. 9(b), 9(c), 9(d) demonstrate the change in magnetic field effect obtained when the size (cross section) and proximity of the inner pole 310 is altered relative to the outer pole 320. To that end, moving from the model of FIG. 9(b) to the model of FIG. 9(d), the cross-sectional size of the inner pole 310 is incrementally increased relative to the cross-sectional size of the outer pole 320, with FIG. 9(c) demonstrating the inner pole as being about the same size as the corresponding outer pole 320. In addition, moving from the model of FIG. 9(b) to the model of FIG. 9(d), the spacing between the inner pole 310 and outer pole 320 is incrementally decreased.

Figure 9C:
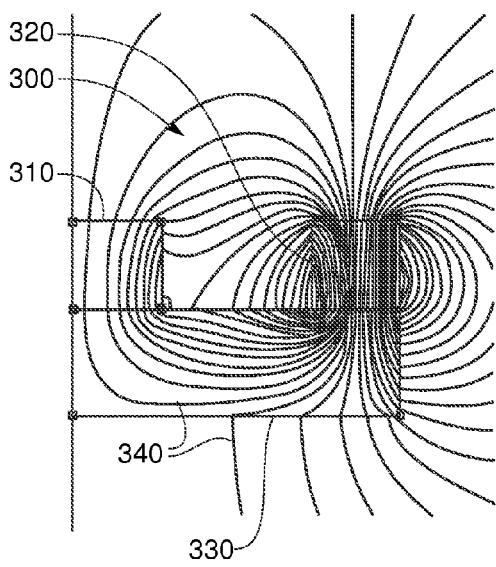
Figure 9D:
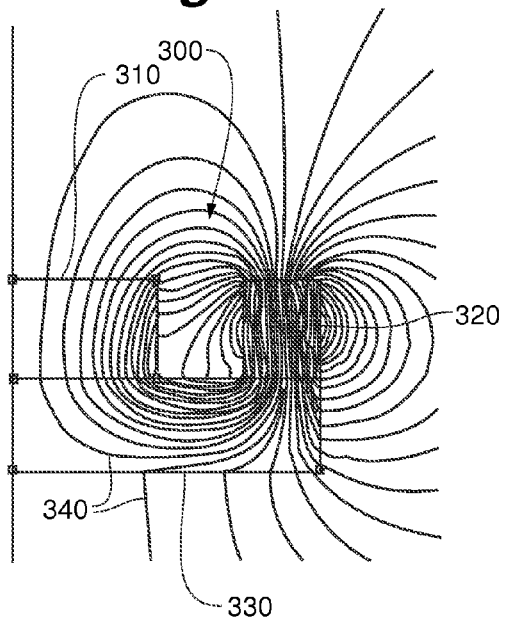

Similar to that shown in FIG. 8, FIGS. 9(a)-9(d) illustrate that magnetic field shapes can be prescribed, only in this case via manipulation of the cross-sectional sizes and spacing of the magnets of the inner and outer poles 310, 320. For example, the inner and outer pole configurations illustrated in FIGS. 9(c) and 9(d) are shown as providing more effective magnetic fields between the poles 310, 320 as opposed to the models illustrated in FIGS. 9(a) and 9(b). In particular, as opposed to the configurations of FIGS. 9(a) and 9(b), the configurations of FIGS. 9(c) and 9(d) generate field lines 340 having greater spectrum (both longitudinally and vertically) outward from the assembly 300, while maximizing the field lines 340 bridging the inner and outer poles 310, 320.

Thus, similar to that described above for FIG. 8, the concepts drawn from FIGS. 9(a)-9(d) can be particularly useful when applied to magnetron turnarounds, yet for different reason. For example, the inner and outer pole configurations of FIGS. 9(c) and 9(d), as to the relative sizing and spacing of their magnets, lead to more effective magnetic conditions being achieved, quite similar to the straight portions of the racetrack magnetrons. Likewise, such configurations would provide a further means for lessening the cross-corner effect and the non-uniform sputtering that results there from. As described below, in certain embodiments with reference to FIGS. 10 and 11, the magnetron turnarounds are configured with magnets of the inner pole 310 having equal or greater cross-sectional size than the magnets of the outer poles 320. Further, in certain embodiments, the magnetron turnarounds are configured with magnets of the outer poles 320 being offset from the magnets of the inner pole 310 at a spacing similar to (e.g., no greater than) what is provided at the straight portions of the magnetron. In certain embodiments, as described below, the configurations of FIGS. 8 and 9(c)-(d) can be combined with regard to magnetron turnarounds.

Embodied Characteristics of Magnetron Turnarounds

Figure 10:
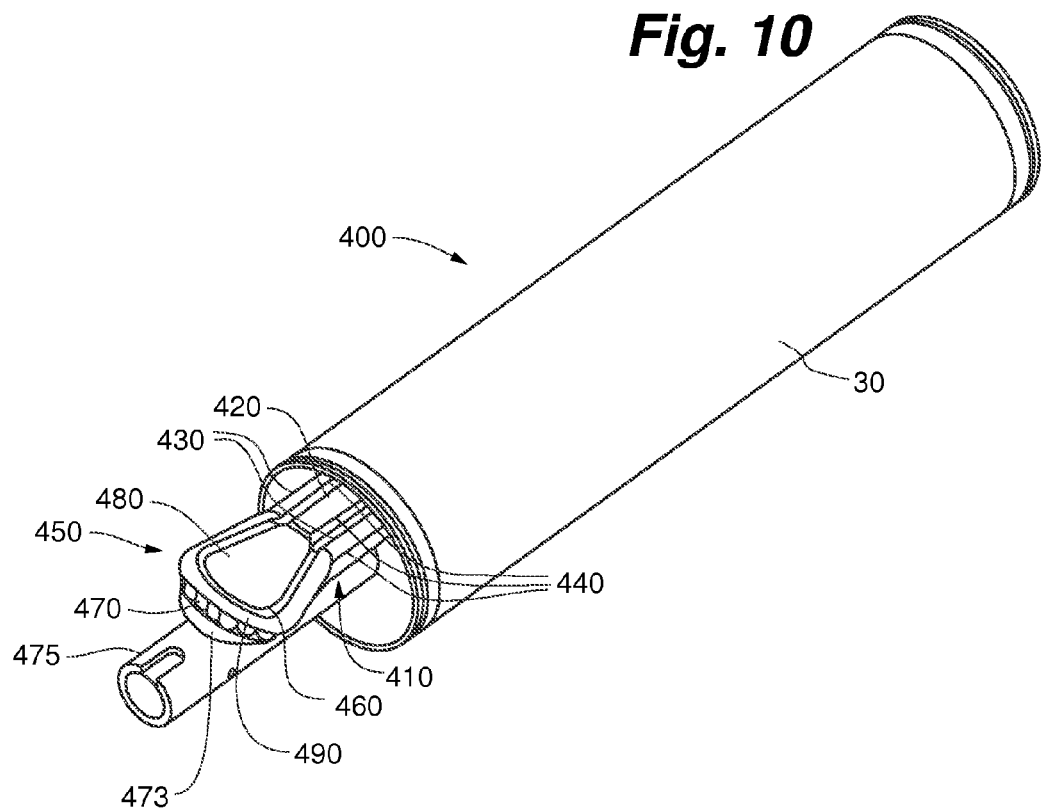
FIG. 10 shows a partial perspective view of an exemplary magnetron, shown relative to a cylindrical target, in accordance with certain embodiments of the invention.
Figure 11:
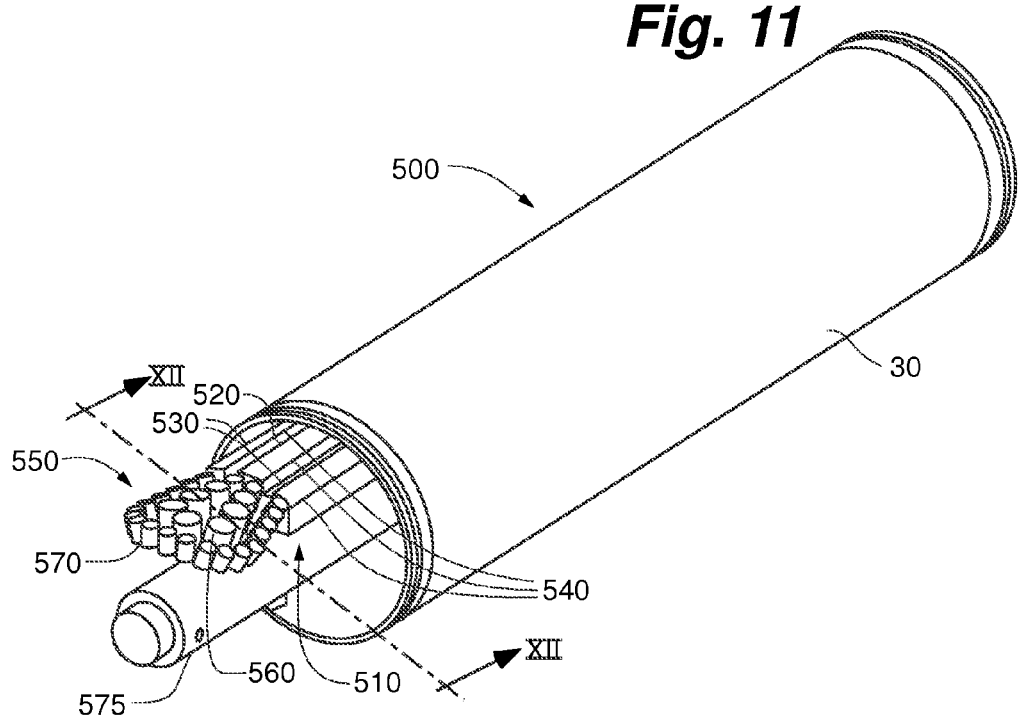
FIG. 11 is a partial cut-away perspective view of another exemplary magnetron, shown relative to a cylindrical target, in accordance with certain embodiments of the invention.

In light of the above, attention was given to the design of the magnetron turnarounds, when taken as a whole. As described above, certain aspects of the poles, when modified at the turnarounds, could lead to better balance of magnetic conditions around the magnetron as well as enhanced field effectiveness. As described hereinafter, by varying the shapes of the magnetron turnarounds (or ends) from their conventionally-accepted semi-circular shapes, better charge balance at the ends can be achieved without adversely impacting cylindrical target design. For example, in certain embodiments, the shape of the turnarounds is configured to accommodate a greater capacity of inner pole, while still remaining sufficiently compact so as to fit within and function with conventional cylindrical targets. Further, in certain embodiments, the inner pole at the turnarounds is shaped so as to have curvature that substantially mirrors the curvature of the outer pole at the turnarounds. FIGS. 10 and 11 depict examples of magnetrons modified with widened ends, each shown relative to a rotary sputtering target, in accordance with certain embodiments of the invention. In particular, FIG. 10 shows principal components, in breakout fashion, of an exemplary cylindrical magnetron target assembly 400, while FIG. 11 provides a partial cut-away view of a similar assembly 500 (as compared to the assembly 400 of FIG. 10).

The assemblies 400 and 500 are illustrated with magnetrons 410 and 510, respectively, each having similar characteristics there between. For example, the magnetron 410 of the assembly 400 of FIG. 10 includes inner and outer poles 420 and 430, forming straight portions 440 that, in certain embodiments, protrude in an outward fanning orientation at their ends 450. With reference to the fanning orientation of the magnetron ends 450, the corresponding shape of such ends 450 is likely best coined as fan-shaped, but the invention should not be limited to such. Instead, the shape of the ends can be formed as desired so long as the poles 420, 430 thereof each extend angularly outward from the straight orientation along the straight portions 440. This relationship can be more clearly seen from the magnetron end 550 illustrated in FIG. 11, with reference to their inner and outer poles 520, 530.

As described above with reference to FIG. 7, configuring the magnetron ends to be circular-shaped makes it physically impossible to magnetically balance the inner and outer poles 130, 140 threat because the ends do not allow sufficient space to accommodate the warranted inner pole magnets. However, angularly widening the ends affords the space sufficient to increase the amount of inner pole, for example, as depicted in FIG. 11, without significantly increasing the size of the magnetron design. To that end, the cavity defined at the turnarounds is increased to such extent so that each of inner and outer poles can have separate yet similarly shaped paths about the turnarounds. Further regarding the fanning orientation at the ends, and with reference to FIG. 11, in certain embodiments, the spacing between the poles 520, 530 at the ends 550 is kept substantially constant there between. Consequentially, charge balance can be achieved in similar fashion as achieved with planar magnetrons, thereby reducing the cross-corner effect and promoting good deposition uniformity from cylindrical targets used therewith. To that end, it should be appreciated that the ends 450 and 550 of the magnetrons shown in FIGS. 10 and 11 significantly depart from being circularly shaped, as depicted in FIG. 7.

Furthermore, in light of that described with regard to FIGS. 8 and 9(c)-(d) above, the embodied magnetron design enables the turnarounds to be further prescribed to balance magnetic conditions around the magnetron. As described above, widening the ends enables the cross-corner effect to be reduced; however, further modification to the turnaround characteristics enables a better uniformity not only for the magnetic field shape between the inner and outer poles, but also for the density of the corresponding field lines. Thus, a better concert of the magnetic conditions between ends and straight portions of the magnetron can be achieved. As a consequence, the cross corner effect can be further mitigated.

For example, with reference to FIG. 11 (and as described above and shown in FIG. 8), in certain embodiments, the magnets of the outer poles 530 are configured to be outwardly oriented (angled) from the magnets of the inner pole 520. While FIG. 11 shows outward orientation of the pole magnets both at the straight portions 540 as well as at the ends 550, the invention should not be limited to such, as outward orientation of the pole magnets may be limited to the ends 550 (as described above with regard to FIG. 8).

Likewise, while FIG. 11 illustrates outward orientation of the magnets 560, 570 of both inner and outer poles 520, 530 (with a greater angle of outward orientation with regard to the outer pole magnets 570 than the inner pole magnets 560), the invention should not be limited to such, as outward orientation may be limited to the outer pole magnets 570 (as described above with regard to FIG. 8).

With further reference to FIG. 11 (and as described above and shown in FIGS. 9(c) and 9(d)), in certain embodiments, the magnets 570 of the outer poles 530 are sized to be less than or equal to the magnets 560 of the inner pole 520. Further, in certain embodiments, the magnets 570 of the outer poles 520 are offset from the magnets 560 of the inner pole 510 at a spacing similar to (e.g., no greater than) what is provided at the straight portions 540 of the magnetron 510. As a result, the magnetic field effect generated at the magnetron ends 550 is not lessened in achieving better balance of magnetic conditions around the magnetron 510, thereby not being susceptible to the problems previously encountered with techniques such as weakening magnetic confinement at the turnarounds or spatially varying the supply of reactive gas supply, as described above.

In spite of the above, it should be appreciated that certain variations with regard to the angularly-widened ends of the magnetron shown in FIGS. 10 and 11 may result in less desirable results. For example, while the magnetron of FIG. 11 depicts an end 550 with both opposing hemispheres thereof being angularly widened, it may be presumed that such widening may only be needed with respect to one of the hemispheres. To that end, while widening only one end hemisphere (and keeping the other end hemisphere circular in shape) may allow for increased accommodation of inner pole magnet(s), such construction is found to still promote the cross-corner effect. In particular, the plasma density (and in turn, sputtering rates) is found to build up along the straight areas of the target and then found to lower (losing charge particles) speed around the ends. As such, in certain embodiments, to achieve film deposition uniformity, both of the opposing hemispheres of the magnetron ends have an angularly-widened profile. In certain embodiments, the opposing hemispheres have substantially similar angularly-widened profiles.

With reference to the magnetron 510 of the assembly 500 of FIG. 11, the ends 550 of the inner and outer poles 520, 530, in certain embodiments, are each formed as a plurality of magnets 560, 570, respectively. However, the invention should not be limited to such, as one or more of the poles 520, 530 can alternately be formed of single continuous magnet bodies. As shown in FIG. 10, in certain embodiments, one or more of the pluralities of magnets 460, 470 can be mounted on separate magnetic plates 480, 490, respectively, or on a single plate, e.g., formed of pure iron or mild steel. With reference to FIG. 11, the magnets 560, 570 can be held together with corresponding coupling means, e.g., clamps, used there between, alternatively or in addition to being mounted to plates, tubes, or the like as ascertained from FIG. 10.

Widening the ends 450, 550 in the fashion as described with reference to FIGS. 10 and 11, increases the radius of the turns of the magnetrons 410, 510; however, such configuration still presents potential of intensifying the erosion in these areas. In certain embodiments, as depicted in FIG. 11, this can be partially alleviated by using stronger (e.g., larger sized), yet fewer, magnet(s) for the inner pole 420, 520. Alternately, while not shown, the inner poles 420, 520 of the magnetrons 410, 510 of FIGS. 10 and 11, respectively, can alternatively be formed via a plurality of horseshoe-like magnets, with the horseshoe ends of such magnets forming the inner pole along the magnet string. To that end, in such alternate embodiments, the horseshoe magnets can be separated and circularly strung at the magnetron ends 450, 550, thereby achieving a condition for even stronger inner magnet mass.

The use of the embodied magnetic assembly may be particularly useful when reactive gases (e.g., comprising oxygen and/or nitrogen) are used in the sputtering process. During sputtering operations in which reactive gases are used, the problem of non-uniform deposition rates near the ends of a target may be compounded, particularly when operating in the transition between metal-mode and full poisoned mode. The regions of more intense plasma (usually at the ends of the target) sputter faster than low-intensity regions, thus more quickly consuming the reactive gas making the high intensity regions more metallic. The more metallic regions, in turn, have an even higher sputter rate. The interaction is very non-linear and results not only in variations of deposition rate, but also causes variations in film stoichiometry.

For any excessive erosion that continues to persist at the turnarounds, in certain embodiments, the magnetron assembly can be provided with an oscillating motion that periodically moves the assembly, as embodied herein, such that the turns reside on different portions of the target at different times. For example, in certain embodiments, longitudinal movement (e.g., oscillation) is provided for the magnetron 410 or 510 within cylindrical target 30. The magnetrons 410, 520, in certain embodiments, can be configured to be movable in a generally axial direction (i.e., longitudinally) by at least about one-half centimeter, and in more preferable embodiments, more than about one centimeter, with such movement being intended to substantially even out the target wear pattern of the assemblies 400, 500. In even more preferable embodiments of the invention, the entire magnetron 410, 510 is adapted to move generally axially up to 4 centimeters or more. An example of an apparatus for providing oscillation of magnetic array assembly 80 is described in U.S. patent application Ser. No. 11/171,054 (filed Jun. 30, 2005, titled "Cylindrical Target With Oscillating Magnet For Magnetron Sputtering"), the entire contents of which are hereby incorporated by reference. Oscillators of this nature can be obtained commercially from General Plasma Inc. (Tucson, Ariz., USA) or Sputtering Components, Inc. (Owatonna, Minn.). Thus, in certain method embodiments, a magnetic array assembly of the described nature is moved (e.g., in a back-and-forth manner) longitudinally during sputtering.

Embodied Characteristics Involving Magnetron Orientation Relative to Target

As described above, the cross-corner effect refers to a phenomenon for conventional racetrack magnetron assemblies (such as shown in FIG. 7) whereby magnetic conditions are found to significantly dampen (forming a "pot hole" of sorts for the magnetic field) when coming out of the circular ends of the magnetron. This lack of uniformity of the magnetic field around the magnetron leads way to non-uniform plasma density being formed. Correspondingly, when used within a cylindrical target, the magnetron leads to differing erosion rates occurring across the target. As is known, lack of erosion uniformity at the target prompts corresponding non-uniformity with regard to sputtering from the target. However, as described above, if the magnetic conditions around the magnetron are generally brought into concert (e.g., via introduction of angularly-widened ends, and optionally, by further modifying certain variables with regard to the pole magnets at the ends), the cross-corner effect can be effectively reduced. As further detailed below, in certain embodiments, the cross-corner effect can be further reduced (and even minimized) by enabling the orientation of the magnetron to be selectively adjustable relative to the target.

With reference to FIG. 11, the cavities at each of the magnetron turnarounds for the inner pole magnets 560 are defined by (and as such, are internal to) the outer pole magnets 570. As such, different strengths and/or sizes of magnets are selected (and as further described, are warranted) for the inner and outer poles 520, 530 to help bring the magnetic conditions around the magnetron 510 into concert. While such conditions help to reduce the cross-corner effect, they present an obstacle to further reducing such effect. One of the reasons for this is the quantity of variables at play, e.g., the varying characteristics/properties of the differing magnets and their collective effect on lengthy and largely rigid magnetrons. It should also be appreciated that the magnetic properties of the magnets can vary over time. Consequently, the magnetic conditions around the magnetron can correspondingly vary over time. One way to address these issues is by employing a means by which one can modify (or "fine-tune") the magnetic conditions as imparted on the target. While embodiments described up until now have involved modifying direct features of the magnetron itself, embodiments described below involve modification to indirect, or ancillary, features of the magnetron. To that end, in certain embodiments, the magnetron's orientation is configured to be selectively adjustable, e.g., via one or more of its spacing and its symmetry, relative to the target.

It should be appreciated that there have been previous attempts in the art to adjust magnetron orientation relative to the target. For example, some attempts have involved shifting the magnetron to a different axial position within the cylindrical target. However, such axial shifting generally leads to significant change to the magnetic field at the target surface overlaying a substrate. For example, looking to FIG. 8, if the supporting plate 230 of that magnetron assembly 200 were to be shifted even 5° to the right or left of the axial position shown, there would be a significant change in erosion effect on the target surface directly overlaying a substrate conveyed there below. While this erosion change may be warranted for certain sputtering applications, it would not be warranted in modifying (or "fine tuning") the magnetic conditions as initially designated. In particular, such previous attempts of shifting the magnetron as a whole to a different axial position about the target has a far more dramatic effect on the target surface directly overlaying the substrate as opposed to adjusting the spacing and/or symmetry of one or more portions of the magnetron relative to such target surface. To that end, shifting the magnetron to a different axial position about the target has offers little with regard to reducing the cross-corner effect at such target surface, but instead simply involves creating the same effect yet shifting it to a different surface region of the target.

The concept of adjusting the orientation of the magnetron relative to the target, in certain embodiments, relates to the construction of the magnetron. For example, with reference to FIG. 11, the magnets 560, 570 of the inner and outer poles 520, 530, respectively, can be held together with corresponding coupling means, e.g., clamps, used there between, alternatively or in addition to being mounted to one or more plates (such as plate 465 shown in FIG. 10), tubes, or the like. As further shown in FIG. 11, such magnet assemblies are further supported by a rod 575 (referenced as 475 in FIG. 10) that extends lengthwise through the target 30. As should be appreciated, the orientation of the poles 520, 530 relative to the target 30, and maintaining that orientation, is significant for producing the desired sputtering effect on the target 30. One known manner of maintaining the orientation of the poles 520, 530 is by mounting the inner and outer pole magnets 560, 570 on a plate (shown in FIG. 10 as 473), with the plate then being coupled (e.g., via fasteners, such as bolts) to the rod 575.

In certain embodiments, means are provided for adjusting the orientation of the magnetron along one or more longitudinal segments of its longitudinal extent. For example, such means can stem from the coupling means used for the inner and outer poles (e.g., the support plate 465 shown in FIG. 10) or can extend from the rod (475 in FIGS. 10 and 575 in FIG. 11) extending lengthwise through the cylindrical target. In certain embodiments, such means involves the use of one or more shims. The practice of shimming has been used in the art to further aid the sputtering effect on the target 30. For example, for planar magnetron target assemblies, shimming has involved using one or more shims or plates (typically formed of ferromagnetic material) being positioned between the magnetron poles and the sputtered surface of the planar target (with the shims typically placed on the planar surface of the target). Use of such shims in this manner allows the shape of the magnetic field to be modified (or shunted) at the target's sputtering surface, thereby leading to more uniform erosion thereof. In effect, this more uniform erosion of the target surface enables an increase in target utilization and sputtering uniformity.

Figure 12:
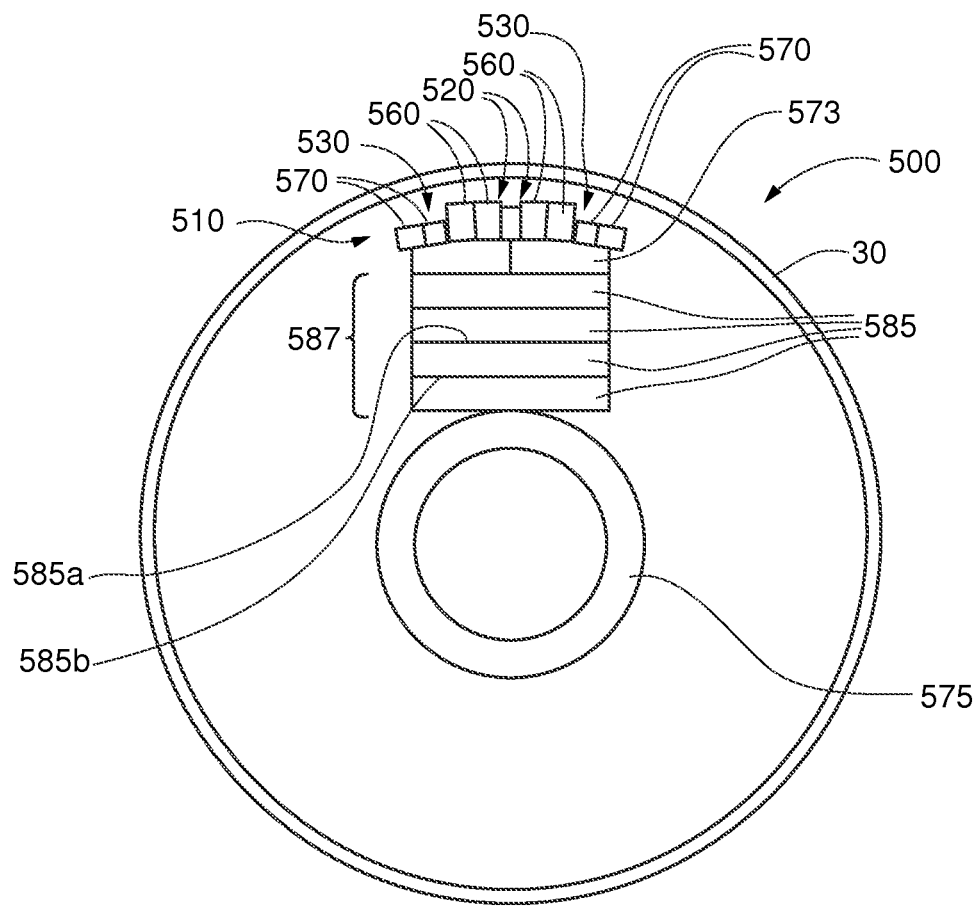
FIG. 12 is a cross-sectional view of the magnetron of FIG. 11, along the lines XII-XII, as situated in a cylindrical target, wherein a first shim type is used according to certain embodiments of the invention.

As described above, in the case of cylindrical targets (with reference to FIGS. 2, 10, and 11), the magnetrons are generally housed within the targets. In use, the magnetron is fixed (or oscillated back and forth along an axis parallel to the longitudinal extent of the target) and the target is rotated about the magnetron. In certain embodiments, a form of shimming can also be provided with such assemblies; however, this generally involves positioning one or more shims between the center rod and the target surface. For example, FIG. 12 shows a cross section of the cylindrical magnetron target assembly 500 of FIG. 11, with the addition of a first type of shim 585 positioned between the rod 575 and the magnetron 510. Shimming in this manner enables the magnetron 510 to be raised (or lowered) relative to the target 30, thereby modifying the distance between the magnetron 510 (and its corresponding magnetic field) and the target 30 (and its sputtering surface).

Figure 13:
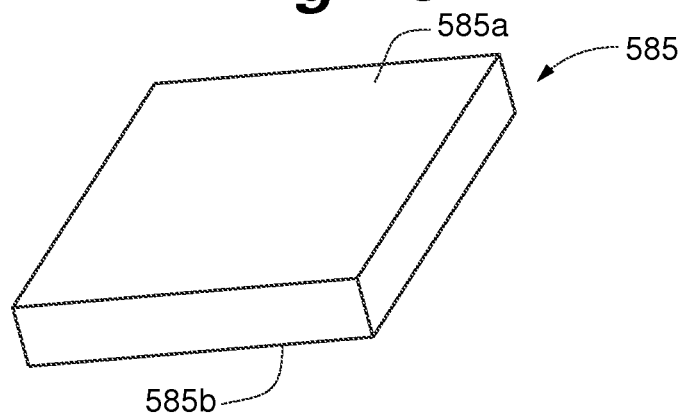
FIG. 13 is a perspective view of the first shim type of FIG. 12 according to certain embodiments of the invention.

With further reference to FIG. 12, in certain embodiments, a plurality of the shims 585 are used to form a stack 587 to provide the desired shimming height for the magnetron 510. However, it should be appreciated that such stack 587 can just as well be formed of a single shim 585 if the thickness (or height) of the shim is correspondingly configured. FIG. 13 shows a top perspective view of the shim 585. As illustrated, the shim 585 has a planar profile, having a top surface 585a and a bottom surface 585b that are substantially parallel with each other. As illustrated, because the shim 585 has a planar profile, the stack 587 of shims 585 provides a "like effect" on the longitudinal hemispheres of the magnetron 510 relative to the target 30. To that end, via use of the one or more shims 585, the inner and outer poles 520, 530 can be raised (or lowered) in similar fashion relative to the target 30. As a result, the spread of the magnetic field lines permeating from each inner/outer pole pairing can be varied based on the distance between the magnetron 510 and the target 30. In certain embodiments, the magnetron 510 is selectively positioned relative to the target 30 over two axes. For example, the magnetron 510 can be constructed so as to oscillate along an axis parallel to the longitudinal extent of the target 30 (as already described above) with such axis being selectively positioned along a further axis perpendicular to the target's longitudinal extent (via use of shim(s) 585). Enabling variability with regard to the shim height, and as a consequence, the spacing between the magnetron and the target, further enables an increase (or decrease) in field effect at the target for maintaining the field effect at, and thereby achieving sputtering uniformity from, the target.

Up until now, when referring to the longitudinal hemispheres (generally, the outer poles 530 of the magnetron 500 in FIG. 11) of the embodied racetrack magnetrons, the hemispheres have been generally considered (and correspondingly illustrated) as being substantially similar, or nearly mirror-images of each other. Put another way, the longitudinal hemispheres of the magnetrons have been generally represented as symmetrical to each other, with such hemispheres also being similarly symmetrical to the target (e.g., target 30 in FIG. 11).

Figure 14:
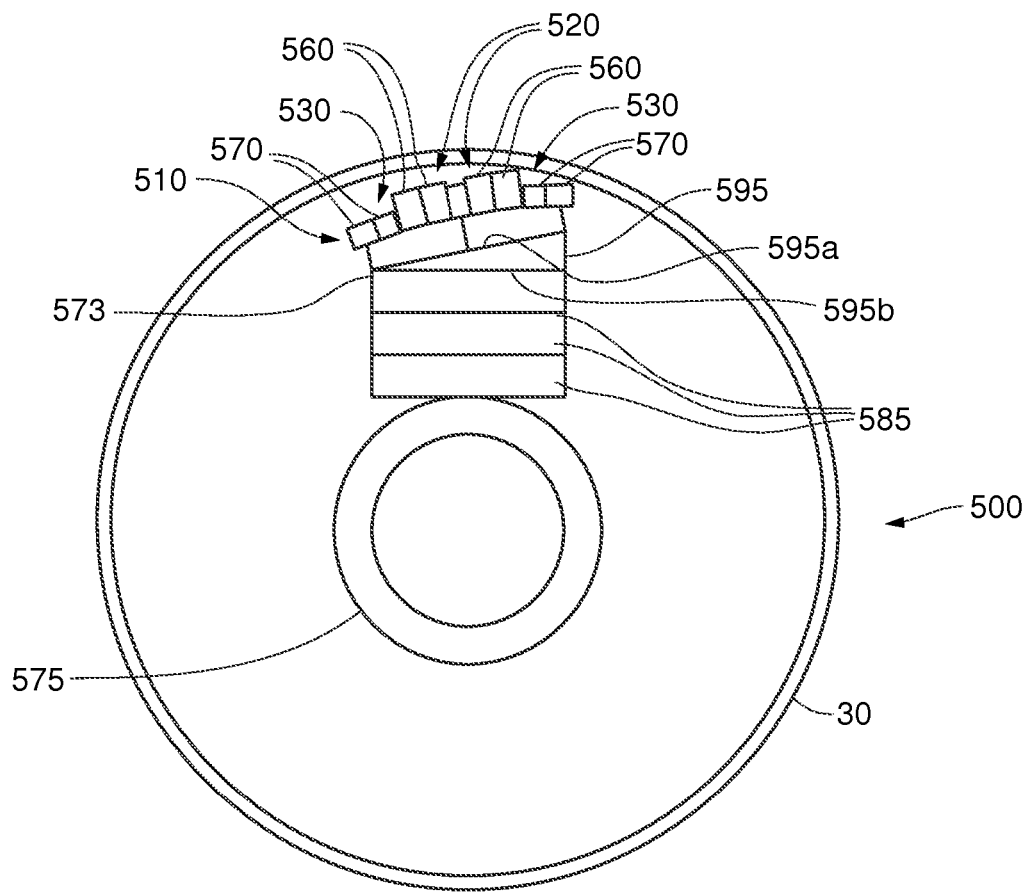
FIG. 14 is an alternate representation of the magnetron as shown in FIG. 12, wherein a second shim type is used according to certain embodiments of the invention.

FIG. 14 illustrates an alternate representation of the cylindrical magnetron target assembly 500 in FIG. 12, wherein a second type of shim 595 (and optionally, one or more of the first type planar shims 585) is used in the shim stack 587' positioned between the rod 575 and the inner and outer poles 520, 530 of the magnetron 510. Again, shimming in this manner enables the magnetron 510 to be raised (or lowered) relative to the target 30, thereby modifying the distance between the magnetron 510 (and the corresponding magnetic field) and the target's sputtering surface. Also, similar to that described above, the magnetron 510 can be used so as to oscillate along an axis parallel to the longitudinal extent of the target 30 with such axis being selectively positioned along a further axis perpendicular to the target's longitudinal extent (via use of shim 595).

Figure 15:
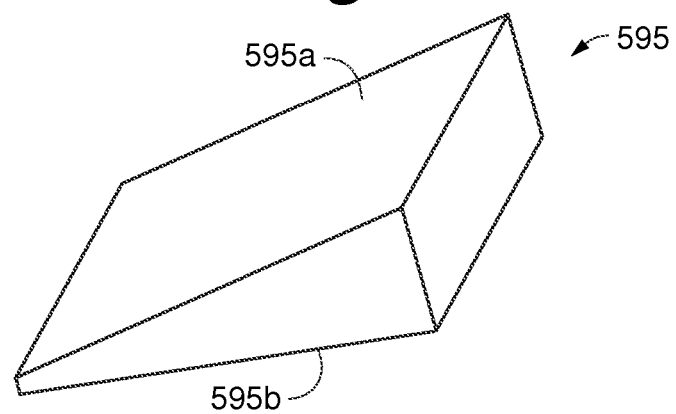
FIG. 15 is a perspective view of the second shim type of FIG. 14 according to certain embodiments of the invention.

However, contrary to the planar shim 585 shown in FIG. 12, the second type of shim 595 has a non-planar profile. In certain embodiments, the shim 595 has a wedge-shaped profile. FIG. 15 shows a top perspective view of one exemplary shim 595. As shown, the wedge shape of the shim 595 has a top surface 595a and a bottom surface 595b that are not parallel with each other. While the top surface 595a is shown with a slope and the bottom 595b is shown without slope, it should be appreciated that either or both may have slopes, while creating a like effect on the magnetron 510. In using such shim 595, the longitudinal hemispheres of the magnetron 510 can be made asymmetrical relative to the target 30, with the magnetic field lines from the inner/outer pole pairings of each hemisphere correspondingly altered relative to the target 30. Put another way, use of the shim 595 can effectively raise (has an increased shimming effect for) one of the longitudinal hemispheres relative to the target 30, while the other longitudinal hemisphere is lowered (having a decreased shimming effect for) relative to the target 30. As a result, the intensity of the magnetic field to the target 30 can be correspondingly enhanced relative to the raised hemisphere of the magnetron and reduced relative to the lowered hemisphere of the magnetron 510. To that end, based on any variances in the inner and outer pole magnets, a more uniform erosion of the target surface can be achieved over time with such symmetry flexibility, further enabling an increase (or decrease) in field effect at, and thereby achieving sputtering uniformity from, the target.

It should be appreciated that shimming for cylindrical magnetron target assemblies generally involves positioning shims at spaced points along the length of the magnetrons. For example, along 10-12 foot magnetron lengths, it is common to have shims spaced every 2 feet across the length of the magnetron. To that end, while FIGS. 12 and 14 show cross-sectional views of the magnetron 510 at points where one or more of the shims 585 and 595 are used, it should be appreciated that this is only one of a plurality of locations across the length of the magnetron 510 that accommodate such shims. As described below, in certain embodiments, the non-planar shims 595 are only used at shimming points proximate to ends of the magnetron 510.

In using the non-planar shims 595 along the extent of the magnetron 510, as described above, the intensity of the magnetic field to the target 30 can be enhanced relative to the raised magnetron hemisphere and reduced relative to the lowered magnetron hemisphere. While there is application in providing such a shift in magnetic field effect along the length of the magnetron 510, there is also application in providing such shift (and corresponding effect) at only certain positions along the magnetron length. For example, in certain embodiments, the shimming locations across the magnetron 510 may involve a combination of one or more of each of the shimming configurations shown in FIGS. 12 and 14. As a result, the magnetron 510 would have a twisted appearance, with twisted regions corresponding to the regions in which the non-planar shim 595 is used. By twisting of the magnetron 510 in select regions, one is able to "fine tune" the magnetic conditions across the magnetron 510 to promote the warranted target utilization for achieving sputtering uniformity.

Returning to that previously described above, by constructing opposing ends of a racetrack magnetron to have angularly-widened profiles (and optionally, by further modifying certain variables with regard to the pole magnets at the ends), it has been determined that magnetic conditions can be brought into concert around the magnetron. As a result, the cross-corner effect can be correspondingly reduced, which enables more uniform plasma to be generated around the magnetron for sputtering purposes involving cylindrical targets. In certain embodiments, the non-planar shims 595 are used at the racetrack ends on the magnetron 510 to twist the magnetron 510 in these areas. Use of the shims 595 at the end areas of the magnetron 510 has been found to be an effective way of closing in on true constant magnetic conditions from the magnetron 510, so as to minimize any cross-corner effect. With the plurality of the magnets 560, 570 used at such ends, there is enhanced flexibility in these areas, which allows for greater twisting if needed. In certain embodiments, the 10 inches from each of the opposing ends of the magnetron 510 can be twisted for minimizing the cross-corner effect.

With reference to the non-planar shim 595 illustrated in FIGS. 14 and 15, it should be appreciated that the degree of twisting of the magnetron 510 is largely based on the degree of slopes of the shim's top and/or bottom surfaces 595a, 595b. In general, a significant twisting of the magnetron 510 is not requisite to impart significant change in magnetic conditions and overall effect at the target. To that end, in certain embodiments, the slope of the top surface 595a can be in the general range of about 5° to 15°. Thus, depending on the size of the underlying cylindrical magnetron target assembly, one or both variables involving (i) length of twisting along magnetron ends and (ii) slope of the non-planar shim can be varied as desired to "fine tune" the magnetic conditions of the magnetron, resulting in a more uniform plasma for sputtering purposes.

Deposition Chambers

Figure 16:
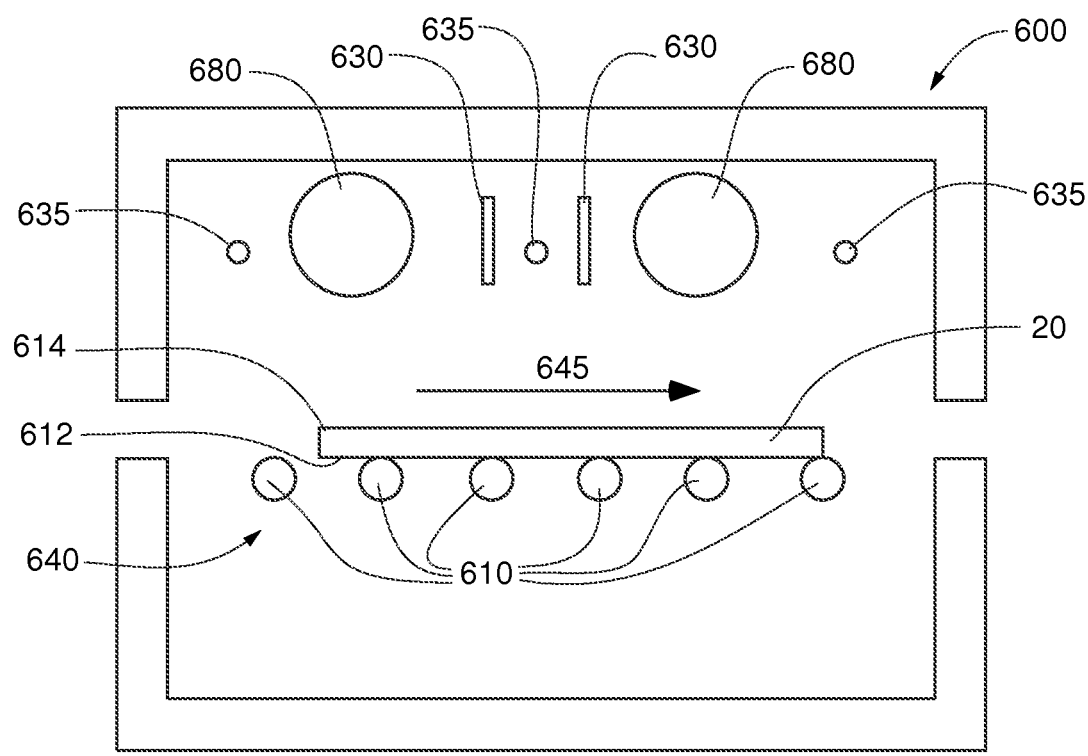
FIG. 16 is a cross-sectional side view of an exemplary deposition chamber which may be used to sputter target material onto a surface of a substrate according to an embodiment of the invention.
Figure 17:
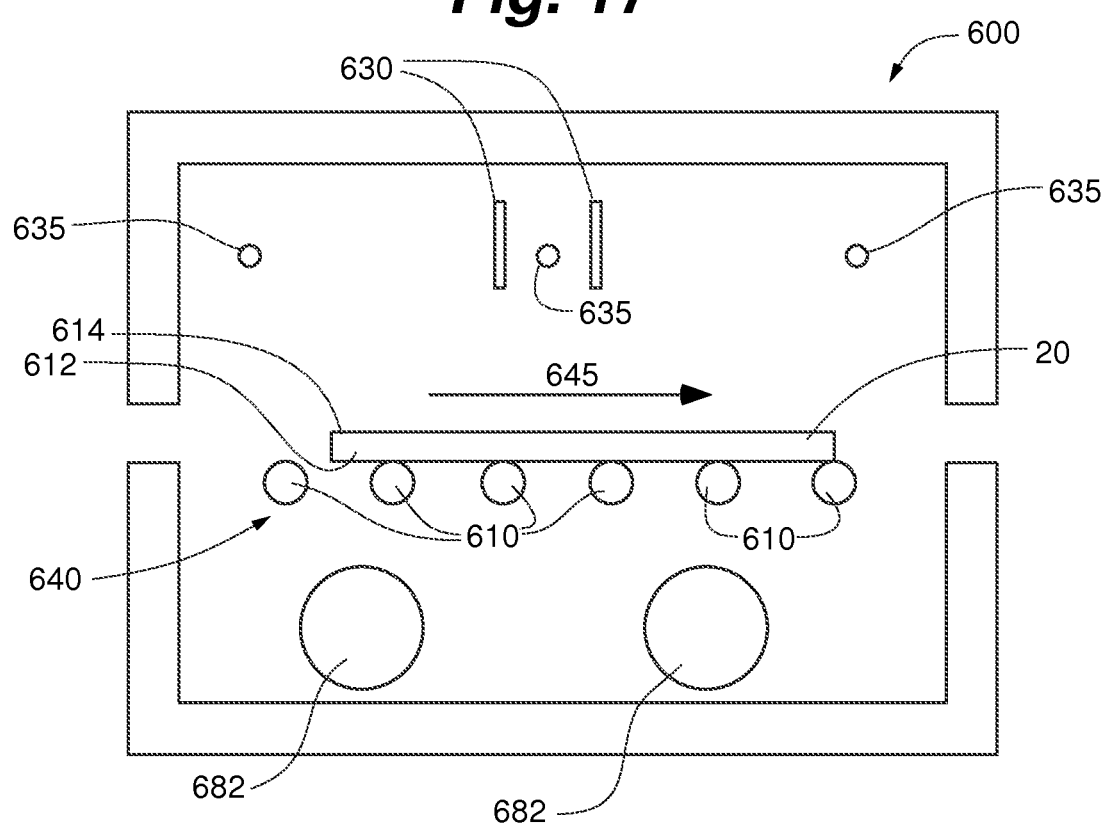
FIG. 17 is a cross-sectional side view of another exemplary addition deposition chamber which may be used to sputter target material onto a surface of a substrate according to an embodiment of the invention.
Figure 18:
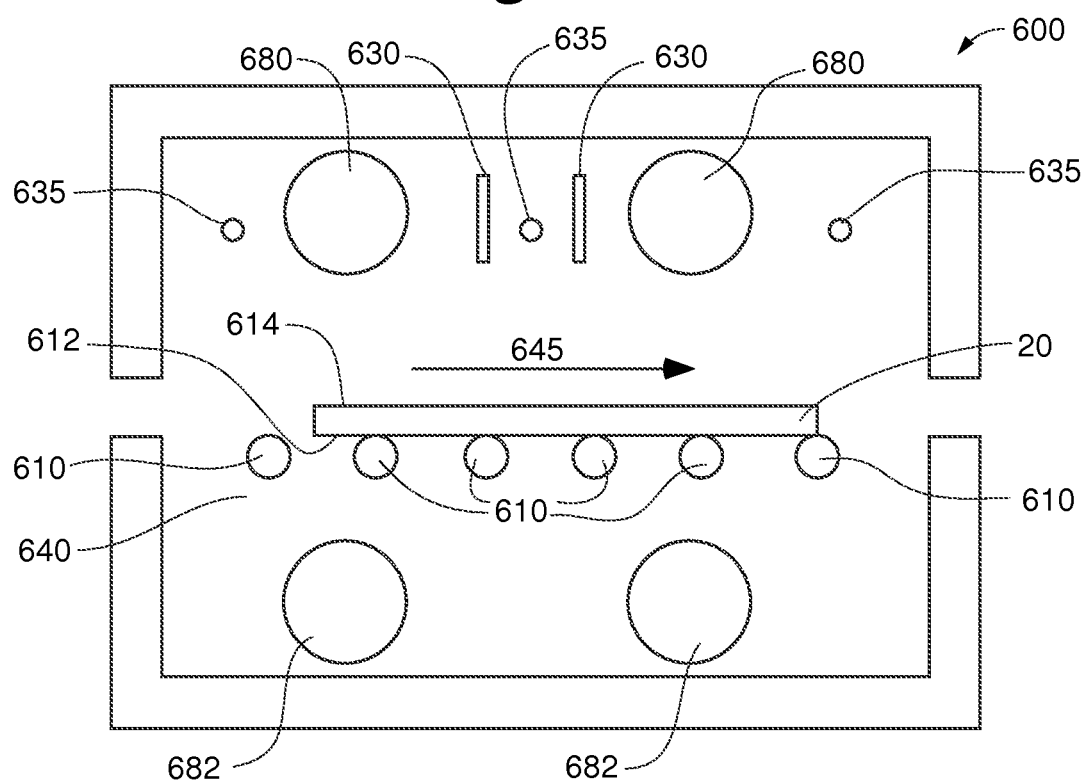
FIG. 18 is a cross-sectional side view of a further exemplary deposition chamber which may be used to sputter target material onto a surface of a substrate according to an embodiment of the invention.

FIGS. 16-18 are cross-sectional side views of a deposition chamber which may be used to perform sputtering of target material in accordance with certain embodiments of the invention. In FIG. 16, the deposition chamber 600 comprises a substrate support 640 defining a path of substrate travel 645 extending through the deposition chamber. Preferably, the path of substrate travel 645 extends substantially horizontally through the deposition chamber 600. In the embodiments of FIGS. 16-18, the substrate support defines a path of substrate travel extending through the deposition chamber 600 between a chamber inlet and a chamber outlet.

Preferably, the substrate support 640 is configured for maintaining (e.g., supporting) the substrate 20 in a horizontal configuration while the substrate 20 is being coated (e.g., during conveyance of the substrate 20 through the deposition chamber 600). Thus, the support 640 desirably is adapted to convey a sheet-like substrate 20, and preferably multiple sheet-like substrates that are spaced-apart from one another, through the deposition chamber 600 while maintaining the/each substrate 20 in a horizontal orientation (e.g., wherein a top major surface 614 of the/each substrate 20 is upwardly oriented while a bottom major surface 612 of the/each substrate 20 is downwardly oriented). In the embodiments shown in the present figures, the substrate support 640 comprises a plurality of spaced-apart transport rollers 610. Typically, at least one of the rollers 610 is rotated (e.g., by energizing a motor operably connected to the roller) such that the substrate 20 is conveyed through the deposition chamber 600 along the path of substrate travel 645. When the substrate is conveyed over such rollers, the bottom surface 612 of the substrate 20 is in direct physical (i.e., supportive) contact with the rollers 610. The substrate 20 is typically conveyed through the deposition chamber 600 at a speed of about 100-500 inches per minute. In certain embodiments of the invention, the substrate 20 is a sheet of glass that is on the substrate support 640 during conveyance, and wherein other sheets of glass are also on the substrate support 640, such sheets of glass being spaced-apart from one another on the substrate support 640 and conveyed in such a spaced-apart configuration. While the illustrated substrate support 640 comprises a plurality of spaced-apart rollers 610, it is to be appreciated that other types of substrate supports can be used.

In certain embodiments, such as that illustrated in FIG. 16, the deposition chamber 600 comprises a downward coating configuration adapted for coating a top major surface 614 of the substrate 20. In such embodiments, the downward sputtering configuration comprises one or more upper targets 680 positioned above the path of substrate travel 645 through the deposition chamber 600. Additionally, the deposition chamber 600 can be provided with upper gas distribution pipes 635 (e.g., having outlets that are) positioned above the path of substrate travel 645. It will typically be preferred to also provide upper anodes 630 above the path of substrate travel 645. When provided, the upper anodes 630 are preferably positioned adjacent upper targets.

In certain embodiments, such as that illustrated in FIG. 17, the deposition chamber 600 comprises an upward coating configuration adapted for coating a bottom major surface 612 of the substrate 20. In such embodiments, the upward sputtering configuration comprises one or more lower targets 682 positioned beneath the path of substrate travel 645. Lower gas distribution pipes (not shown) may be used, and are typically positioned beneath the path of substrate travel 645. Similarly, optional lower anodes (not shown) can be positioned below the path of substrate travel 645. When provided, lower anodes are typically positioned adjacent the lower targets 682. Upward sputtering systems are described in U.S. patent application Ser. Nos. 09/868,542, 09/868,543, 09/979,314, 09/572,766, and 09/599,301. FIG. 14 shows an embodiment of the invention in which both upper and lower targets 680, 682 are present to provide both upward and downward sputtering configurations. In the embodiments illustrated in FIGS. 16-18, the targets 680, 682 may be offset longitudinally from one another to further promote uniform sputtering/coating and even target depletion.

Thus, embodiments of APPARATUS FOR CYLINDRICAL MAGNETRON SPUTTERING are disclosed. One skilled in the art will appreciate that the invention can be practiced with embodiments other than those disclosed. The disclosed embodiments are presented for purposes of illustration and not limitation, and the invention is limited only by the claims that follow.

What is claimed is:

1. A cathode target assembly for use in sputtering target material onto a substrate comprising: a generally cylindrical target extending about a longitudinal axis, the target configured to rotate about the axis; and a magnetic array, the array carried within and extending along the longitudinal axis of the target and maintained in a substantially static state with rotation of the target, the array forming a racetrack configuration comprising inner and outer magnetic poles, the racetrack configuration having a straight portion and opposing end portions thereof, the inner and outer magnetic poles extending parallel to each other in a first direction along the straight portion, the inner and outer magnetic poles fanning outward from the first direction in forming the end portions; and wherein the straight portion comprises one inner magnetic pole flanked by two outer magnetic poles, wherein the one inner magnetic pole splits into two inner magnetic pole portions which fan outward and then connect at each of the end portions, wherein spacing between the two outer magnetic poles and the two inner magnetic pole portions is substantially similar along each of the end portions, the inner and outer magnetic poles collectively adjustable in multiple dimensions relative to the cylindrical target, the dimensions comprising adjustments of the inner and outer magnetic poles in both spacing and symmetry relative to the cylindrical target, the adjustments to the inner and outer magnetic poles are provided via shim stacks each having planar and non-planar shims and spaced along a corresponding length of the magnetic array and each centrally situated between the magnetic array and a support rod extending along the longitudinal axis, the shim stacks extending from the support rod wherein the non-planar shims angle crosswise relative to the longitudinal axis of the support rod, the adjustments providing uniform magnetic effect on the cylindrical target over the corresponding length of the magnetic array.

2. The assembly of claim 1 wherein the inner and outer magnetic poles are provided with corresponding plates positioned thereon at each of the end portions.

3. The assembly of claim 1 wherein the two outer magnetic poles at each end portion extend angularly outward in differing directions yet are offset from the first direction by a substantially similar angle, and wherein each of the two outer magnetic poles at each end portion further extend angularly inward from the differing directions and join with each other, thereby closing each of the end portions.

4. The assembly of claim 1 wherein each of the end portions have fan-shaped profiles.

5. The assembly of claim 3 wherein the two inner pole portions at each end portion extend angularly outward in similar fashion to the corresponding two outer magnetic poles at the end portions, and wherein each of the inner magnetic poles at each end portion further extend angularly inward and join with each other in similar fashion to the corresponding two outer magnetic poles at the end portions.

6. The assembly of claim 1 wherein the spacing is substantially similar to spacing between the outer and inner magnetic poles at the straight portion.

7. The assembly of claim 5 wherein the two outer magnetic poles at each of the end portions have an orientation that is angled outward relative to orientation of the corresponding two inner magnetic pole portions.

8. The assembly of claim 5 wherein one or more of the outer magnetic poles and the inner magnetic pole portions at the end portions comprise a plurality a magnets.

9. The assembly of claim 8 wherein each of the outer magnetic poles and the inner magnetic pole portions at the end portions comprises a plurality of magnets, and wherein the plurality of magnets forming the outer magnetic poles are sized to be less than or equal to the magnets forming the inner magnetic pole portions.

10. The assembly of claim 8 wherein each of the outer magnetic poles and the inner magnetic pole portions at the end portions comprises a plurality of magnets, and wherein the plurality of magnets forming the inner magnetic pole portions comprises stronger, yet fewer number of magnets in comparison to the corresponding plurality of magnets forming the outer magnetic poles.

11. The assembly of claim 5 wherein magnetic conditions of the inner and outer magnetic poles are substantially constant around the racetrack of the magnetron.

12. The assembly of claim 1 wherein each of the end portions is mounted on a support plate, wherein the support plate is comprised of one or more sections extending along a longitudinal extent of the magnetic array.

13. The assembly of claim 12 wherein one or more of the end portions is adapted to be selectively adjustable in orientation relative to the cylindrical target.

14. The assembly of claim 13 wherein the one or more of the end portions is selectively adjustable in spacing from the cylindrical target.

15. The assembly of claim 14 wherein one or more planar shims is operatively joined underneath the support plate for adjusting the spacing of the one or more opposing end portions.

16. The assembly of claim 13 wherein the one or more end portions is selectively adjustable in symmetry relative to the cylindrical target.

17. The assembly of claim 16 wherein one or more non-planar shims is operatively joined underneath the support plate for adjusting the symmetry of the one or more opposing end portions.

18. The assembly of claim 1 wherein the target is adapted for one or more of upward and downward sputtering configurations, the target being rotatable by means comprising a drive end block containing a motor suitable for rotating the target.

19. The assembly of claim 1, wherein the adjustment in spacing comprises vertical displacement of the inner and outer magnetic poles relative to the cylindrical target, and wherein the adjustment in symmetry comprises angular displacement of the inner and outer magnetic poles relative to the cylindrical target.

20. A cathode target assembly for use in sputtering target material onto a substrate comprising: a generally cylindrical target extending about a longitudinal axis, the target configured to rotate about the axis; and a magnetic array, the array carried within the target and maintained in a substantially static state with rotation of the target, the array forming a racetrack configuration comprising inner and outer magnetic poles, the racetrack configuration having a straight portion and opposing end portions thereof, the inner and outer magnetic poles extending parallel to each other in a first direction along the straight portion, each of the end portions having a fan-shaped profile, one or more of the end portions being selectively adjustable in multiple dimensions relative to the cylindrical target, the dimensions comprising adjustments of the inner and outer magnetic poles in orientation relative to the cylindrical target, the adjustments to the inner and outer magnetic poles are provided via shim stacks spaced along a corresponding length of the magnetic array and each centrally situated between the magnetic array and a support rod extending along the longitudinal axis, the shim stacks extending from the support rod and each having a non-planar shim that angles crosswise relative to the longitudinal axis of the support rod, the adjustments providing uniform magnetic effect on the cylindrical target over the corresponding length of the magnetic array.

21. The assembly of claim 20 wherein each of the end portions is mounted on a support plate, wherein the support plate is comprised of one or more sections extending along a longitudinal extent of the magnetic array.

22. The assembly of claim 21 wherein the one or more of the end portions is selectively adjustable in spacing from the cylindrical target.

23. The assembly of claim 22 wherein one or more planar shims is operatively joined underneath the support plate for adjusting the spacing of the one or more opposing end portions.

24. The assembly of claim 21 wherein the one or more of the end portions is selectively adjustable in symmetry relative to the cylindrical target.

25. The assembly of claim 24 wherein one or more non-planar shims is operatively joined underneath the support plate for adjusting the symmetry of the one or more opposing end portions.

26. The assembly of claim 20 wherein the straight portion comprises one inner magnetic pole flanked by two outer magnetic poles.

27. The assembly of claim 26 wherein the two outer magnetic poles at each end portion extend angularly outward in differing directions yet are offset from the first direction by a substantially similar angle, and wherein each of the two outer magnetic poles at each end portion further extend angularly inward from the differing directions and join with each other, thereby closing each of the end portions.

28. The assembly of claim 27 wherein the one inner magnetic pole splits into two inner magnetic pole portions at each of the end portions, wherein the two inner pole portions at each end portion extend angularly outward in similar fashion to the corresponding two outer magnetic poles at the end portions, and wherein each of the inner magnetic poles at each end portion further extend angularly inward and join with each other in similar fashion to the corresponding two outer magnetic poles at the end portions.

29. The assembly of claim 28 wherein spacing between the two outer magnetic poles and the two inner magnetic pole portions is substantially similar along each of the end portions.

30. The assembly of claim 29 wherein the spacing is substantially similar to spacing between the outer and inner magnetic poles at the straight portion.

31. The assembly of claim 28 wherein the two outer magnetic poles at each of the end portions have an orientation that is angled outward relative to orientation of the corresponding two inner magnetic pole portions.

32. The assembly of claim 28 wherein one or more of the outer magnetic poles and the inner magnetic pole portions at the end portions comprise a plurality of magnets.

33. The assembly of claim 32 wherein each of the outer magnetic poles and the inner magnetic pole portions at the end portions comprises a plurality of magnets, and wherein the plurality of magnets forming the outer magnetic poles are sized to be less than or equal to the magnets forming the inner magnetic pole portions.

34. The assembly of claim 32 wherein each of the outer magnetic poles and the inner magnetic pole portions at the end portions comprises a plurality of magnets, and wherein the plurality of magnets forming the inner magnetic pole portions comprises stronger, yet fewer number of magnets in comparison to the corresponding plurality of magnets forming the outer magnetic poles.

35. The assembly of claim 28 wherein magnetic conditions of the inner and outer magnetic poles are substantially constant around the racetrack of the magnetron.

\* \* \* \* \*